United States Patent
Kim

(10) Patent No.: US 11,444,698 B2
(45) Date of Patent: *Sep. 13, 2022

(54) OPTICAL TRANSMITTER OPERATING BURST MODE AND CONTROL METHOD OF OPTICAL TRANSMITTER OPERATING BURST MODE

(71) Applicants: Jeongsoo Kim, Sejong (KR);
PICadvanced S.A., Ílhavo (PT)

(72) Inventor: Jeongsoo Kim, Sejong (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/118,625

(22) Filed: Dec. 11, 2020

(65) Prior Publication Data
US 2021/0111536 A1   Apr. 15, 2021

Related U.S. Application Data

(63) Continuation of application No. 16/634,157, filed as application No. PCT/KR2018/008548 on Jul. 27, 2018, now Pat. No. 10,931,378.

(30) Foreign Application Priority Data

Jul. 29, 2017   (KR) .................. 10-2017-0096595
Feb. 12, 2018   (KR) .................. 10-2018-0017283

(51) Int. Cl.
| | | |
|---|---|---|
| H04B 10/08 | (2006.01) | |
| H04B 10/564 | (2013.01) | |
| H04B 10/50 | (2013.01) | |
| H04B 10/572 | (2013.01) | |
| H04B 10/69 | (2013.01) | |
| H01S 5/024 | (2006.01) | |
| H01S 5/042 | (2006.01) | |
| H01S 5/06 | (2006.01) | |

(Continued)

(52) U.S. Cl.
CPC ....... *H04B 10/564* (2013.01); *H01S 5/02453* (2013.01); *H01S 5/0428* (2013.01); *H01S 5/0612* (2013.01); *H01S 5/0683* (2013.01); *H01S 5/06216* (2013.01); *H04B 10/504* (2013.01); *H04B 10/572* (2013.01); *H04B 10/6911* (2013.01)

(58) Field of Classification Search
CPC .. H04B 10/564; H04B 10/504; H04B 10/572; H04B 10/6911; H04B 10/40; H04B 10/503; H04B 10/25137; H04B 10/50; H01S 5/02453; H01S 5/0428; H01S 5/0612; H01S 5/06216; H01S 5/0683
USPC ......... 398/38, 161, 162, 182, 183, 192, 193, 398/195–199, 37, 186
See application file for complete search history.

(56) References Cited

U.S. PATENT DOCUMENTS 5,311,005 A * 5/1994 Visocchi .............. H04B 10/504
250/205
8,923,775 B2   12/2014 Timothy et al.
(Continued)

*Primary Examiner* — Hibret A Woldekidan
(74) *Attorney, Agent, or Firm* — Antonio Ha & U.S. Patent, LLC

(57) ABSTRACT

The present invention provides an optical transmitter including a semiconductor laser and a control method thereof for preventing crosstalk between channels in an NG-PON2 with a 100 GHz channel spacing by reducing a wavelength drift of the semiconductor laser. The wavelength drift occurs between a few nanoseconds and a few hundreds of nanoseconds from the beginning of a burst when the semiconductor laser is operated in a burst-mode.

20 Claims, 19 Drawing Sheets

(51) Int. Cl.
 *H01S 5/062* (2006.01)
 *H01S 5/0683* (2006.01)

(56) References Cited

U.S. PATENT DOCUMENTS

| | | | |
|---|---|---|---|
| 11,038,588 B1* | 6/2021 | Lee ........................ | H04B 10/25 |
| 2009/0274471 A1* | 11/2009 | Bowler .................. | H04B 10/27 |
| | | | 372/29.011 |
| 2014/0119396 A1* | 5/2014 | Dvir ..................... | H04B 10/564 |
| | | | 372/38.02 |

* cited by examiner

OPTICAL TRANSMITTER OPERATING BURST MODE AND CONTROL METHOD OF OPTICAL TRANSMITTER OPERATING BURST MODE

CROSS-REFERENCE TO RELATED APPLICATIONS

This application is a continuation application of U.S. patent application Ser. No. 16/634,157, filed on Jan. 26, 2020, which is a national-stage application of International Patent Application No. PCT/KR2018/008548, filed on Jul. 27, 2018, which claims priority to Korean Patent Application No. 10-2017-0096595, filed on Jul. 29, 2017, and No. 10-2018-0017283, filed on Feb. 12, 2018, in the Korean Intellectual Property Office, the disclosures of which are incorporated by reference herein in their entireties.

TECHNICAL FIELD

The present invention relates to an optical transmitter and a method of controlling the optical transmitter, and more particularly, to an optical transmitter with a function that reduces a crosstalk between channels occurring according to wavelength variation and a method of controlling the optical transmitter for reducing the crosstalk in case of the optical transmitter being operated in a burst-mode.

DISCUSSION OF RELATED ART

Recently, a communication standard, so called a next-generation passive optical network 2 (NG-PON2), has adopted a time wavelength division multiplexing (TWDM) scheme for multiplexing. The TWDM scheme allows multiple subscribers connected to an optical fiber to select any one of four or eight available wavelength channels and multiple subscribers using the same wavelength channel share the optical fiber based on a time division multiplexing scheme where they exchange signals only on predetermined time slots.

In the TWDM scheme, four or eight different wavelength channels are simultaneously used, and the wavelength channels are set such that they are spaced apart by 100 GHz. Also, when one of the subscribers using the same wavelength channel is busy in communication, the other subscribers do not communicate over the same wavelength channel. In this example, a laser of an optical transmitter belonging to a subscriber who is not communicating is disabled.

In case the time division multiplexing scheme being applied, a laser source (e.g., semiconductor laser) associated with a user who has not been in communication is in a state where it emits no light, and if a signal is received from a control server (e.g., a central office), the laser source may change the state to be able to emit light.

Given that the aforementioned operation may take place explosively in a short time period where a communication permission is given to each subscriber, we refer to as a "burst mode" throughout the present disclosure.

However, in a state where a semiconductor laser does not emit light, if current is applied to the laser to be able to emit light, joule heat is generated by the current flow into the laser so as to change temperature of an active area of the semiconductor laser. Hereinafter, the active area of the semiconductor laser may be referred to as a "laser active area" for the sake of description.

For example, if the current flows through the semiconductor laser which is not in operation to emit light, the joule heat is generated due to the current flow, and the joule heat will be accumulated so as to gradually increase temperature of the laser active area.

Thus, since heat released outside increases along with the rise of the laser active layer temperature, the laser active area temperature is stabilized when the released heat and the generated heat are in equilibrium. For example, the above temperature change occurs within a few milliseconds.

On the other hand, a wavelength of the semiconductor laser is determined by a temperature of the active area of the semiconductor laser, and thus the temperature variation of the semiconductor laser active area due to the variation in driving current results in variation of a lasing frequency of the semiconductor laser.

The temperature of the semiconductor laser is determined according to the heat generated from the semiconductor laser and temperature of a board in which the semiconductor laser is placed. The temperature of the laser active area is eventually stabilized at temperature where the ambient temperature and the heat generated from the semiconductor laser are in equilibrium.

For example, even if the semiconductor laser is generating a certain amount of heat, the variation of the ambient temperature results in the temperature variation of the board where the semiconductor laser is placed to break the thermal equilibrium state, thus causing temperature variation of the semiconductor laser. A distributed feedback laser diode (DFB-LD) is one of semiconductor lasers which can be employed in the NG-PON2.

However, as described above, the lasing frequency of a semiconductor laser is dependent on its active area temperature which varies according to the ambient temperature variation. Generally, 1 degree of the ambient temperature variation may result in approximately 90 picometers of the lasing frequency variation of the semiconductor laser.

In the NG-PON2 standard, its channel spacing is defined as 100 GHz which corresponds to about 800 picometers. Thus, the NG-PON2 standard defines the wavelength of a semiconductor laser to be stabilized within +/−160 picometers around the center wavelength of a desired channel. For example, the temperature of the laser active area where light is generated and emitted needs to be stabilized within +/−2° C.

Since the ambient temperature varies from about −40° C. to 85° C., it should be ensured that such ambient temperature variation does not cause variation in the temperature of the active area of the semiconductor laser. In one example, a thermo-electric cooler (TEC) can be used to keep the temperature of the laser diode chip constant regardless of the ambient temperature variation.

As depicted in FIG. 1, the TEC device has a very slow temperature change speed (e.g., less than 0.08°/milliseconds) even if it is operated at full power. However, in the TWDM-PON of the NG-PON2, a heat amount generated on the laser diode chip when it is in a burst mode is different from that when it is not in the burst mode, thus resulting in the temperature variation of the laser diode chip. Thus, the temperature variation of the laser active area due to the driving of the laser occurs for a short time period (e.g., from a few nanoseconds to a few microseconds).

The upper portion of FIG. 2 depicts a structure of a semiconductor laser where a laser diode chip is disposed on a heat sink, and the heat sink is disposed on a package stem. The lower portion of FIG. 2 depicts a graph showing temperature variation of an active area of the semiconductor laser shown the upper portion thereof according to a pulse width of a pulse driving current when the semiconductor laser is driven by a pulse current driving signal. Depicted in the lower portion of FIG. 2 are locations (semiconductor laser) package concerning the temperature variation of the laser active area. The reference character "S" shows regions of the semiconductor laser that mainly affect the temperature variation of the laser active area. Referring to FIG. 2, when the semiconductor laser is driven according to a pulse-like current driving signal (e.g., the semiconductor laser is in a burst-mode operation), in the laser active area rapid temperature variation occurs according to a pulse width of the current driving signal. Thus, as the pulse width increases, the temperature of the active area continues to increase, but a rise speed of the laser active area temperature gets lowered.

This is because heat energy generated due to a pulse current driving signal would differently affect the temperate rise of the semiconductor laser depending on a distance from the laser active area and a heat transfer rate of material over which the heat spreads.

Referring further to FIG. 2, the closer to the laser active area, the more greatly the temperature variation of the semiconductor active area is affected. It shows rapid variation in temperature at a short time period of a few tens microseconds.

Therefore, if the semiconductor laser is operated in burst-mode, a thermo-electric cooler with a slow response speed cannot control effectively the temperature of the laser active area that varies according to the joule heat during its operation.

FIG. 3 illustrates wavelength variation (or wavelength drift) provided from the semiconductor laser active area until a time of a few microseconds to a few milliseconds elapses since the burst-mode operation of a semiconductor laser begins. Since the wavelength of the semiconductor laser varies directly depending on the temperature variation of the active area thereof, the wavelength variation of the semiconductor laser illustrated in FIG. 3 may be understood to mean the temperature variation of the semiconductor laser active area.

Referring to FIG. 3, according to document(s) published in 2014 by Ayham Al-Banna et al. from Arris Enterprises, temperature variation of a semiconductor laser active layer is so fast that the variation can be noticeable even in a nanosecond time.

An amount of heat generated in the semiconductor laser is different depending on whether the laser is operated in burst-mode or not, thus resulting in rapid temperature variation in the semiconductor laser active area.

In driving the burst-mode semiconductor laser, a method of using a heater on a laser diode chip has been proposed to minimize the temperature variation of the semiconductor laser active area during such a short time period of a few nanoseconds to a few microseconds.

It is described in Paoli et al. (U.S. Pat. No. 5,140,605) that in a high power laser printer, a laser thereof has a pulse-like "on" time of 10 to 100 nanoseconds, which prevents the laser from staying at constant temperature to make the laser output unstable and cause degradation of the print quality.

In order to stabilize the laser output in an "on" state regardless of its on/off operation, Paoli has suggested forming metal resistances on a top portion of the laser diode chip and driving a heater when the semiconductor laser is not in operation to make the temperature of the semiconductor laser stay at a certain level.

FIG. 4(a) illustrates a structure of a semiconductor laser used for communication as described in Richardson et al. (U.S. Pat. No. 5,345,459). In Richardson, a semiconductor laser is formed to have two active areas, one of the two active areas is used for communication, and the other active area is alternately activated with respect to the active area used for communication.

FIG. 4(b) depicts a timing waveform of a semiconductor driving current when the laser active area D is driven by the current pulse, referring to the semiconductor laser structure of the semiconductor with the two laser active areas of FIG. 4(a).

FIG. 4(c) depicts a laser wavelength emitted from the laser active area D when the current pulse is applied to the laser active area D described with reference to FIG. 4(b).

FIG. 4(d) depicts a timing waveform of a pulse current for driving the laser active area D-bar when the laser active area D of FIG. 4(a) is driven by the current pulse of FIG. 4(b).

FIG. 4(e) depicts a laser wavelength emitted from the laser active area D when the laser active area D is driven by a current pulse of FIG. 4(b) and the laser active area D-bar is driven by a current pulse of FIG. 4(d).

In Richardson, since the two laser active areas are driven with the same amount of power, overall power consumption of the semiconductor laser diode chip remains the same regardless of operations of the laser active area used for communication, thus allowing to constantly generate a certain amount of heat throughout the entire semiconductor laser chip regardless of time. Such method for controlling the temperature of the laser active layer based on a heater is referred to as a "first heater control method". However, although the same amount of heat occurs, temperature can vary depending on a distance from a heat source, as shown in FIG. 6. For example, referring to the laser active area of FIG. 6, a degree to which power applied to the laser active area A used for communication affects to the temperature of the laser active area A is different from a degree to which power applied to the laser active area B not used for communication affects to the temperature of the laser active area A used for communication.

That is, as shown in Richardson, the power applied to the laser active area A used for communication is concentrated on a relatively narrow area. However, since a degree to which the power applied to the laser active area B not used for communication affects to the temperature of the laser active area A used for communication is affected by averaged electric power over a relatively large area, it may be hard to completely compensate for the temperature of the laser active area A used for communication even if the same amount of power is injected to both the two active areas. Therefore, regarding a NG-PON2 with a wavelength channel spacing of 800 picometers, it is hard to prevent such rapid temperature variation of the active area within a time period of a few nanoseconds using the previously proposed method.

FIG. 6 depicts respective equal temperature distribution lines 30 of: when power is applied to the laser active area to generate heat; and when power is applied to the heater 10 to generate heat, in case of the heater 10 being disposed on a top surface of the laser active area 20 of a buried hetero structure (BH) semiconductor laser in which the laser active area 20 is buried (or embedded) inside the semiconductor laser chip.

The wavelength stability of light emitted from a semiconductor laser depends on the temperature of the laser active area. Thus, the effect of heat generated from the heater 10 on the temperature of the laser active area is more important than an amount of heat generated by the heater 10. In case of heat being generated in a narrow area, the temperature in the narrow area gets higher and the temperature gets lowered as it goes farther from the heat source.

Referring back to FIG. 2, in case the power applied to the semiconductor laser has a pulse shape over time, the closer a certain area to the laser active area to which the electric power is injected, the faster the effect on the temperature rise of the laser active area. When the electric power is applied to the active area of the semiconductor laser, the temperature rise due to the influence of the area close to the laser active area occurs very rapidly over time, and the heat is spread over the entire of the laser diode chip, thus the temperature rise speed over time in the laser active area becomes moderate.

Such process is described with reference to FIG. 7. In a network operating in burst-mode such as the NG-PON2, the operation of the burst-mode laser begins in response to receiving a burst enable (BEN) signal from an optical line terminal (OLT) which is a communication equipment at a telecom company (e.g., service provider).

When the burst-mode laser receives the BEN signal, a certain level of current is applied to an active area of the burst-mode laser to generate joule heat which increases temperature of the laser active area.

The heat generated in the laser active area increases temperature of adjacent area thereof, and this increased temperature of the adjacent area increases temperature of the laser active area again to make a temperature difference between the laser active area and the adjacent area, so that the heat can spread.

When the burst-mode laser starts to operate, in an initial phase, temperature rises rapidly due to the effect of the adjacent area and the temperature rise curve in the laser active area gets more moderate as heat spreads outward.

The temperature rise in the laser active area depends on an amount of current applied to the semiconductor laser. For example, in case of a semiconductor laser with an active area length of 300 micrometers, the applying of power of 100 mW into the laser active area typically results in temperature rise of approximately 20° C.

Here, it should be noted that in case of the semiconductor laser, a portion of the applied power is converted to light to be emitted outside a chip of the semiconductor laser. Thus, typically, about ⅔ of the applied power affects the temperature rise in the laser active area. That is, when heat corresponding to about 66 mW is generated in the semiconductor laser, the temperature of the semiconductor laser will increase by approximately 20° C.

Therefore, throughout the present invention, with regard to the power applied to the laser active area, the heat, and the temperature, the power applied to the laser active area only refers to power affecting the heat and the temperature other than a portion of the power being converted to the light. Referring to FIG. 7, if power of 100 mW is applied to the laser active area, maintaining temperature of a thermoelectric cooler device at a certain level, the temperature of the laser active area varies more than 20° C., thus resulting in a wavelength shift of more than 1.8 nanometers.

Referring further to FIG. 7, it will be appreciated that laser power affecting the wavelength shift should be understood as power that is converted to the heat other than the power converted to light, out of the power applied to the laser active area, as described earlier.

When the laser diode is on (e.g., BEN signal is received), there occurs rapid temperature variation in an area close to the laser active area (see e.g., a reference number 31 of FIG. 7) and there occurs moderate temperature variation in another area farther from the laser active area (see e.g., a reference number 32 of FIG. 7).

With regard to a case described with reference to FIG. 7, the wavelength shift of more than 1.8 nanometers results in a shift over more than two channels in the NG-PON2 with a channel spacing of 100 GHz (approximately 0.8 nanometers), which limits this type of laser from operating for a stable communication at each channel.

FIG. 8 depicts diagrams for explaining how the temperature of the laser active area varies depending on power applied to a heater when the heater is in operation. Since the heater 10 and the laser active area are spaced apart from each other, even if the power applied to the heater is equal to the power (i.e., the power being converted to heat) applied to the laser active area, temperature rise of the laser active area due to the heater 10 will be relatively low, compared to a magnitude of the power applied to the laser activated area.

FIG. 9 depicts temperature variation of the laser active area in case of power being alternately applied to the heater and the laser active area. Since the temperature of the laser active area has already risen due to the heater when the applying of power to the laser active area starts, the temperature of the laser active area is simultaneously affected by both the temperature rise effect due to the power applied to the laser active area and the temperature drop effect due to the heater being turned off.

However, even if the same amount of power is applied to both the laser active area (e.g., only consider electric power converted to heat) and the heater, the effect of power on the temperature of the laser active area is different from the effect of another power. Since the temperature of the laser active area varies faster by the power applied to the laser active area than by the heater, the temperature of the laser active area starts increasing rapidly at a time when the power is injected to the laser active area, but as time goes by, the temperature rise of the laser active area will be lowered because of the turning off of the heater, as shown in FIG. 9.

That is, as illustrated in FIG. 9, by using the first heater control method where the power is applied to the heater and the laser active area in an alternate manner, the temperature variation of the laser active area can be smaller compared to that of FIG. 7, and the wavelength shift of the laser can be reduced accordingly.

FIG. 10 depicts respective responses of channels 1 and 2 which are simultaneously measured when the conventional first heater control method (where the heater and the laser active area are alternately driven) is used and a laser of channel 2 is in operation (e.g., turned on) in the 4 channel NG-PON2.

In case the laser of the channel 2 is operated in burst-mode, there should be no response at the channel 1. However, there occurs a crosstalk from the channel 2 to the channel 1 if the conventional method is used. This shows that in the conventional method, the heater cannot sufficiently offset the temperature variation of the laser active area.

That is, when the laser active area starts to operate, the temperature of the laser active area is in a stable condition, but the temperature will increase as the power is applied to the laser active area, so that a wavelength of the laser increases accordingly.

Therefore, when the applying of power to the laser active area starts, the temperature of the laser active area will be at the lowest level, so that the output wavelength of the laser becomes the shortest, thus resulting in a crosstalk toward a short wavelength channel in an initial operation phase of the laser.

FIG. 11 is a diagram illustrating a case where power applied to the laser active area is higher than power applied to the heater (which will be referred to as a "second heater control method") for preventing the crosstalk toward a shorter wavelength channel. The crosstalk toward the shorter wavelength channel occurs since the temperature of the laser active area is low in the initial operation phase of the laser, as described above.

Referring to FIG. 11, when the temperature of the laser active area is appropriately adjusted to the channel 2 and the power is applied to the laser active area the laser active area temperature starts increasing rapidly from the temperature due to the heater. As shown in FIG. 11, the laser active area temperature increases to a temperature level corresponding to a longer wavelength than the channel 2, thus resulting in a crosstalk from the channel 2 to a longer wavelength channel such as channel 3.

SUMMARY

In one aspect, the present invention aims to provide an optical transmitter including a semiconductor laser and a control method thereof for preventing crosstalk between channels in the NG-PON2 with a 100 GHz channel spacing by reducing a wavelength drift of the semiconductor laser. The wavelength drift may occur between a few nanoseconds and a few hundreds of nanoseconds from the beginning of a burst when the semiconductor laser is operated in burst-mode.

Further, in another aspect, the present invention aims to provide an optical transmitter including a semiconductor laser and a control method thereof for substantially reducing an elapse time required to stabilize the wavelength prior to transmission of a data signal by applying a separate additional driving power to an light source of the optical transmitter, other than a bias driving power.

According to one aspect of the present invention, there is provided a method for providing power and a data signal to an optical transmitter including a light source after receiving a burst-mode enable (BEN) signal. The method includes a first applying step of applying driving power to the light source, an amplitude of the power increasing with a first average slope, the first applying step being performed after receiving the BEN signal; a second applying step of applying a first modulated signal to the light source, the second applying step being performed after a predetermined time elapses from when the BEN signal is received; and a providing step of a second modulated signal including data for being transmitted, the providing step being performed after the second applying step.

In some embodiments, the method further includes performing a third applying of applying additional power for driving the light source to the light source, the third applying step being performed after receiving the BEN signal.

In some embodiments, the third applying step comprises applying the additional power whose amplitude increases with a second average slope at an initial value.

Here, the initial value is a current value of the driving power or the additional power before the receiving the BEN signal.

Here, the first average slope and/or the second average slope are introduced to show that a current driving signal modulated with a frequency not detectable at a receiver can also be used.

In some embodiments, the second average slope is greater than the first average slope.

In some embodiments, the third applying step comprises: after the first modulated signal has been applied to the light source, stopping the applying of the additional power at a time before the driving power reaches a reference value.

In some embodiments, the second applying step begins after a time of 30 nanoseconds to 70 nanoseconds elapses from the receiving of the BEN signal, the third applying step ends after a time of 40 nanoseconds to 80 nanoseconds elapses from the receiving of the BEN signal, and the third applying step ends after the second applying step begins.

In some embodiments, the third applying step ends upon a maximum of the applied additional power being lower than a predetermined level.

In some embodiments, the driving power and the first and second modulated signals are provided to the optical transmitter.

According to another aspect of the present invention, there is provided an optical transmitter transmitting an optical data signal using a light source subsequent to receiving of a burst-mode enable (BEN) signal. The optical transmitter includes a driver and the light source. The driver is configured to apply a driving power to the light source subsequent to the receiving of the BEN signal; provide a first modulated signal to the light source after a predetermined time elapses from the receiving of the BEN signal; and apply a second modulated signal including data for being transmitted to the light source after another predetermined time elapses from the providing of the first modulated signal. The light source is configured to receive the driving power and the first and second modulated signals from the driver and transmit the optical signal including the second modulated data signal to the optical receiver.

In some embodiments, the driver is further configured to apply additional power separately from the driving power for driving the light source, subsequent to the receiving of the BEN signal.

In some embodiments, the driver is further configured to apply the additional power increasing with a second average slope, subsequent to the receiving of the BEN signal.

In some embodiments, the second average slope is greater than the first average slope.

In some embodiments, the driver is configured to stop the applying of the additional power before the driving power reaches a reference value, after the first modulated signal has been applied to the light source.

In some embodiments, the driver is further configured to: provide the modulated signal to the light source after a time of 30 nanoseconds to 70 nanoseconds elapses from the receiving of the BEN signal; stop the applying of the additional power for driving the light source after a time of 40 nanoseconds to 80 nanoseconds elapses from the receiving of the BEN signal. The applying of the additional power ends after the providing of the modulated signal to the light source.

In some embodiments, the driver is further configured to stop the applying of the additional power upon a maximum of the applied additional power being lower than a predetermined level.

As described above, according to some aspects of the present invention, the wavelength shift of a laser in burst-mode can be minimized or an interference (e.g., crosstalk) to other channels caused due to the wavelength shift can be reduced so as to allow one to use a semiconductor laser in the TWDM-PON such as the NG-PON2 with a narrow channel spacing (e.g., 100 GHz).

In addition, an optical transmitter according to some aspects of the present invention allows one to substantially reduce an elapse time prior to transmission of a data signal by applying a separate additional driving power to a light source of the optical transmitter, other than a bias driving power.

DETAILED DESCRIPTION OF EXEMPLARY EMBODIMENTS

Various modifications and embodiments are possible with respect to the present invention. Particular embodiments are illustrated in drawings and described in detail.

However, this is not intended to restrict the present invention into a particular form of embodiments, it should be understood that all modifications, equivalents or substitutes included in the spirit and scope of the present invention are included. The same reference numbers are used to like elements.

The terms including the ordinal numbers such as first, second, A, B, etc. can be used in describing various elements, but the above elements shall not be restricted to the above terms. These terms are only used to distinguish one element from the other.

For example, a first element could be termed a second element, and a second element could be termed a first element, without departing from the scope of the present invention. Herein, the term "and/or" includes any and all combinations of one or more referents.

It will be understood that when an element is referred to as being "connected" or "coupled" to another element, it can be directly connected or coupled to the other element or intervening elements may be present. The terms used herein are merely used to describe particular embodiments, and are not intended to limit the present invention. The use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Figure 12:
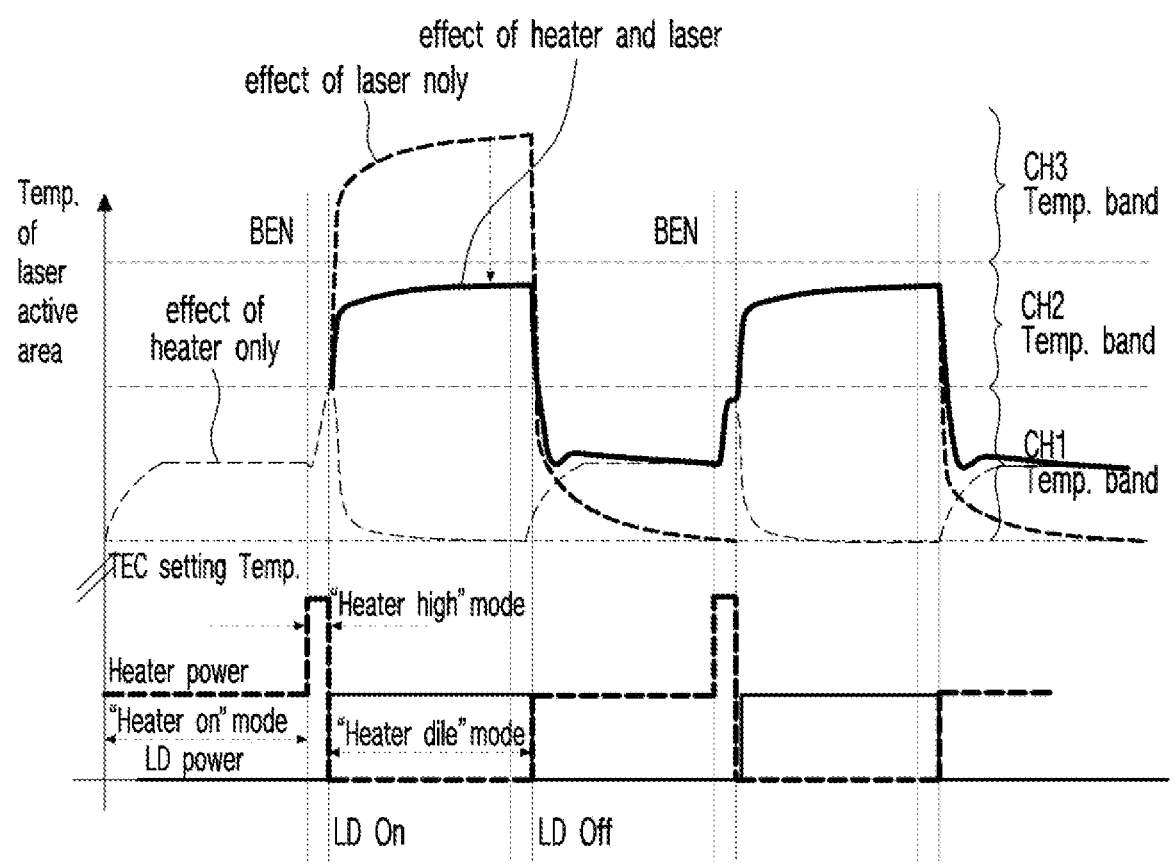
FIG. 12 depicts a diagram representing temperature variation of a laser active area when a heater and a signal with a predetermined width are alternately applied according to a heater power control method according to an embodiment of the present invention.

FIG. 12 is a diagram depicting temperature variation of a laser active area when a heater and a signal with a predetermined width are alternately applied according to a heater power control method according to an embodiment of the present invention. A heater control method used for driving a laser diode chip in this embodiment is referred to as a "third heater control method".

Figure 8:
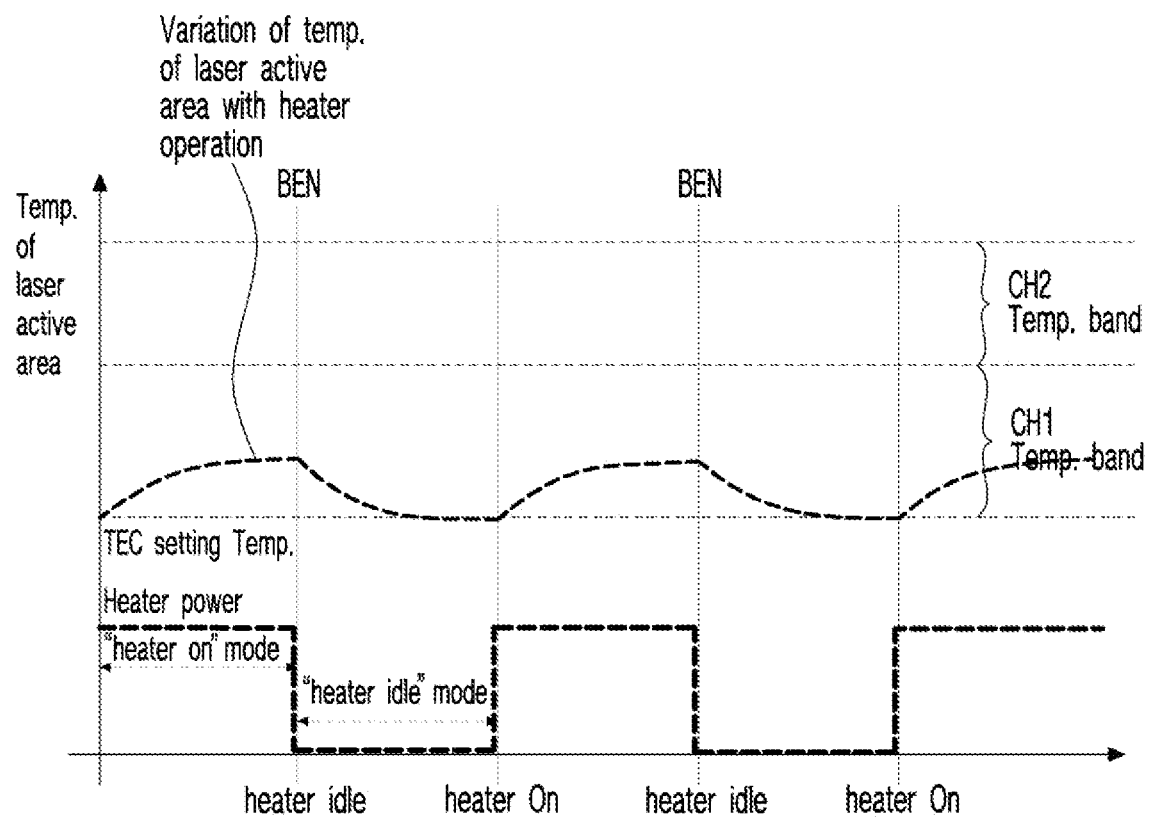
FIG. 8 depicts a graph representing temperature variation of a laser active area due to a heater of a conventional optical transmitter are active, according to prior art.

When the heater is in a state: "heater on" (i.e., first heater power)—which is substantially the same as the state "heater on" of FIG. 8, the heater turned into to a "heater high" node (i.e., second heater power) which is higher in power than the "heater on" in case of the burst enable (BEN) signal being arrived from the system.

In this case, the temperature of the laser active area increases, compared to the "heater on" mode, current for driving the laser will be applied to the laser active area in case of the heater being turned off in the "heater high" mode or the heater becomes below a predetermined power (i.e., turned into "heater idle mode"; third heater power).

A time at which the current is applied to the laser active area for the laser lasing is referred to as a "laser diode (LD) on" mode (i.e., first LD power).

At the beginning of the "LD on mode, temperature of the laser active area is not in the "heater on" mode, but in the "heater high" mode higher in e.g., temperature than the "heater on" mode, and thus a laser wavelength when the laser is operated in the LD on mode becomes close to an allowable region to channel 2.

The "heater high" mode can be set to last for a predetermined time, preferably the predetermined time is a time between a few tens of nanoseconds to a few hundreds of nanoseconds. Such a (relatively) short "heater high" mode only increases temperature around the heater, but it cannot increase temperature the entire laser diode chip.

Generally, the laser active area and the heater are positioned as closely as possible. For instance, the active area of the laser and the heater are positioned within 5 micrometers and this distance is relatively short compared to a size of a semiconductor laser diode of a few hundreds of micrometers.

Therefore, the "heater high" mode can selectively increase the temperature of the laser active area. Since the overall temperature of the laser chip remains low, the temperature of the laser active area drops faster in the "heater idle" mode after the end of the "heater on" mode faster than in a mode after the end of the "heater on" mode of FIG. 8.

After the "heater high" mode, the temperature drop effect of the laser active area due to the heater and the temperature rise effect of the laser active area due to the "LD on" mode are partially offset by each other, but the effect of the power applied to the laser active area is a relatively great, so that the laser active area temperature increases from the time of the "LD on".

Figure 9:
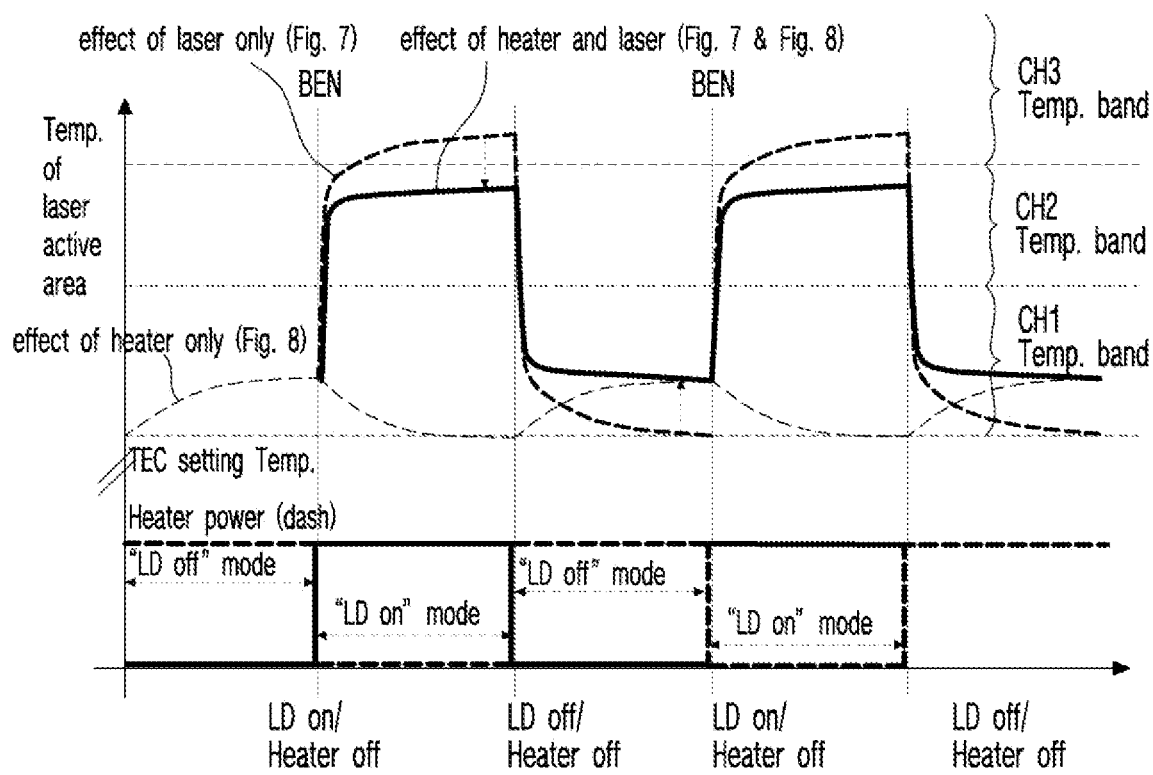
FIG. 9 depicts a graph representing temperature variation of a laser active area when a heater and a signal with a predetermined width are alternately applied to a conventional optical transmitter are active, according to prior art.
Figure 13:
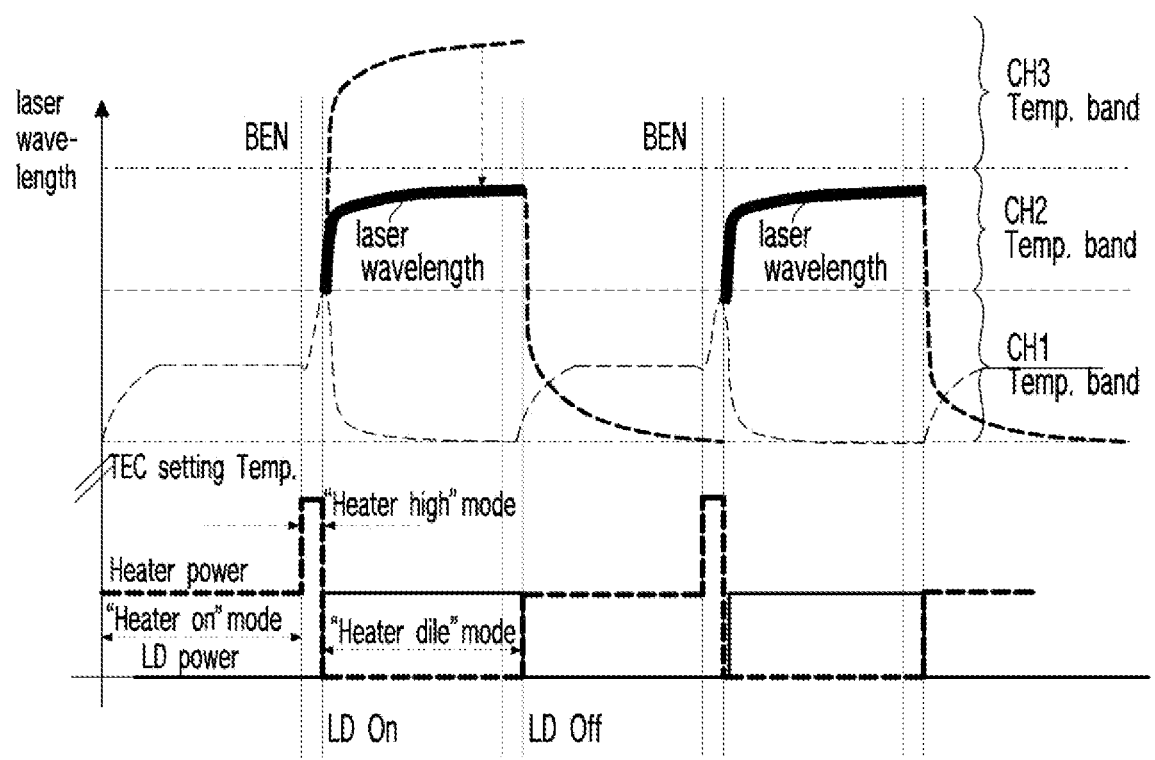
FIG. 13 depicts a diagram representing wavelengths of a laser output from a light source in an optical transmitter when a heater and a signal with a predetermined width are alternately applied according to a heater power control method according to an embodiment of the present invention.

However, since the temperature of the laser active area is ultimately affected as the heater high mode is off, the temperature variation of the laser active area during the "LD on" modes is reduced compared to what is shown in FIG. 9. This reduced temperature variation of the laser active area ensures to minimize wavelength variation of the laser, as depicted in FIG. 13.

Thus, a crosstalk of a burst-mode laser operated at the channel 2 to a shorter wavelength channel such as the channel 1 or a long wavelength channel such as the channel 3 can be reduced at maximum. The heater control method explained above is referred to as a "third heater control method". Table 1 shows how the burst-mode operation on channel 2 affects the operation on channel 1 in case of driving the heater in two modes of the "heater on" and the "heater idle" like the conventional method.

TABLE 1

| | Total number of transmission signals at channel 1 | Number of errors at channel 1 |
|---|---|---|
| In case of only channel 1 being in operation | 92020 | 1135 |
| In case of channel 2 being in operation during operation of channel 1 | 92020 | 1797 |
| Error increment rate at channel 1 | | 58.3% |

It is shown in Table 1 based on the conventional method that the amount of errors at the channel 1 is increased by 58.3% due to a crosstalk from the channel 2 to the channel 1. On the other hand, in one embodiment of the present invention, if a heater is configured to have three modes of the "heater on" mode, the "heater high" mode and the "heater idle" mode and the heater idle mode is set to have lower power than the heater on mode, the amount of errors at the channel 1 is only increased by 9.2%.

Thus, it is verified that if the heater is configured to have three modes of the "heater on" mode, the "heater high" mode and the "heater idle" mode and the heater idle mode is set to have lower power than the heater on mode, the crosstalk between channels can substantially be prevented compared to the conventional method.

Figure 14:
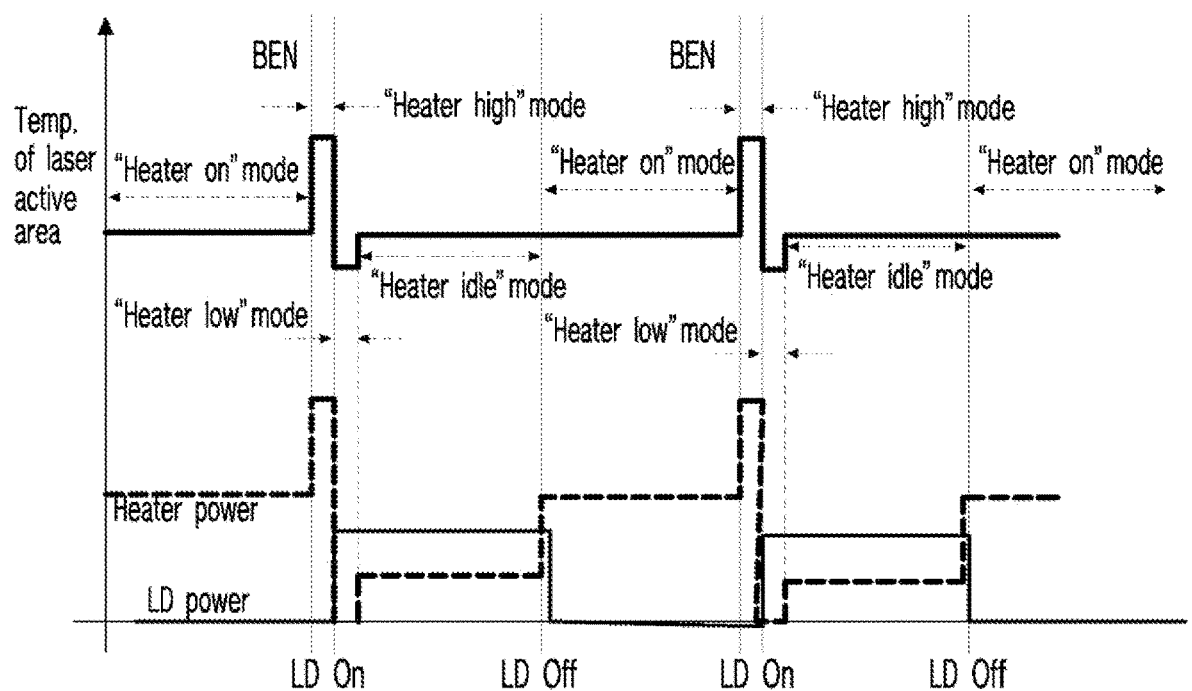
FIG. 14 depicts a diagram representing temperature variation of a laser active area when a heater and a signal with a predetermined width are alternately applied according to a heater power control method according to an embodiment of the present invention.

FIG. 14 depicts a diagram representing temperature variation of a laser active area when a heater and a signal with a predetermined width are alternately applied based on a heater power control method according to an embodiment of the present invention.

FIG. 14 shows a timing sequence performed by a heater. In the timing sequence, the heater receives the BEN signal to be operated in the heater high mode; the heater is in the heater low mode (i.e., fourth heater power) after a predetermined time from the operation of the heater high mode; and the heater is in the heater idle mode after a predetermined time from the heater low mode.

In one embodiment, the heater low power is set to be lower than the heater idle power (The heater control method of the current embodiment is referred to as a "fourth heater control method).

Referring to FIG. 14, since the heater enters into the "heater low" mode which is lower in power than the "heater idle" mode, the temperature drop of the laser active area due to the heater is faster than a case of FIG. 13. This characteristic prevents the temperature rise of the laser active area faster than the case with reference to FIG. 13.

Thus, in one embodiment, the heater is configured to have a power mode including more than four steps of the "heater high", the "heater on", the "heater idle" and the "heater low" modes in an order from the greatest to the smallest, and after receiving the BEN signal, the heater is configured to drive the power mode thereof according to an order of the "heater high", the "heater low", the "heater idle" and the "heater on" modes.

The aforementioned embodiment is directed to an apparatus or method for reducing a crosstalk by controlling a laser diode of an optical transmitter based on the heater control method. In the following embodiments, a method for controlling a power mode applied to the laser active area (i.e., a method for controlling a LD power) is described. The current embodiment of the present invention can be used alone and in conjunction with the first to fourth heater control methods described above.

In the TWDM-PON system such as the NGPON2 where multiple channels are simultaneously used, when a laser operated in burst-mode transmits an optical signal, a crosstalk occurs at a receiver that receives such optical signal.

The receiver receives the optical signal using a photo diode (e.g., avalanche photo diode) that performs an optical-to-electrical conversion thereon and a trans-impedance amplifier (TIA). However, the TIA filters out a direct current (DC) component of the optical signal and distinguishes "1" and "0" signals from each other only based on an alternating current (AC) component thereof.

Since generally the TIA is capable of only extracting and recovering a signal corresponding to a predetermined frequency, the TIA functions to receive only a specific frequency signal that can be detectable thereby and reject (or eliminate) the other frequency signals that cannot be detectable. For example, a TIA that receives 10 Gbps signals may identify low-frequency signals of 100 MHz, or high-frequency signals of above 20 GHz as noises to eliminate the same.

Figure 15:
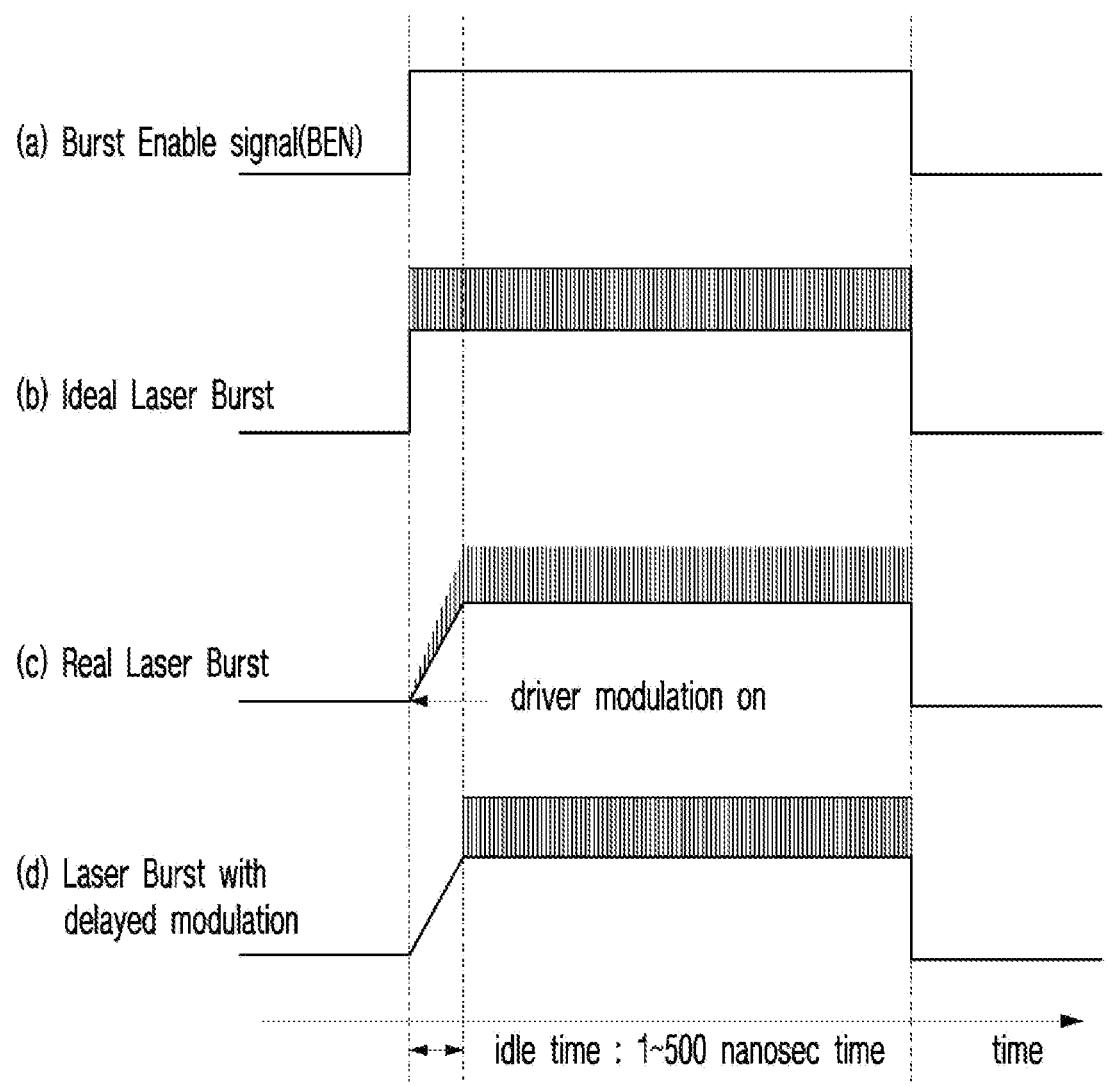
FIG. 15 depicts a graph representing current applied to a light source from a driver in an optical transmitter according to a first embodiment of the present invention.

FIG. 15 depicts a graph representing a current applied to a light source from a driver in an optical transmitter according to an embodiment of the present invention. A semiconductor laser in a burst-mode is operated under a minimum driving current or no current before a BEN signal is received. Here, the minimum driving current is referred to as a current below a threshold current of a laser diode. In general, the operation of a laser in a passive-optical network (PON) system is defined by an extinction ratio (ER) and an average power of an optical signal output therefrom, and thus, in order to meet the ER and the optical signal output, a current level of "0" signals output from the laser may be kept above the threshold current.

For example, in case of a semiconductor laser having a threshold current of 6 mA, a current is set below 6 mA when the laser is off, and current levels for 1 signal and 0 signal are set to be 80 mA and 30 mA, respectively. The aforementioned numbers are only example for explanation, other numbers may be possible without limiting.

In an AC coupling based-laser driving scheme, a semiconductor laser is driven using two currents of Ibias and Imod. The 1's signal is generated by driving the semiconductor laser using a current of Ibias+Imod, and the 0's signal is generated by driving the semiconductor laser using a current of Imod. In a DC coupling based-laser driving scheme, the 1's signal is generated by driving the semiconductor laser using a current of Ibias+Imod/2, and the 0's signal is generated by driving the semiconductor laser using a current of Ibias+Imod/2. Here, Ibias is a DC current and Imod is an AC current.

The receiver filters out a DC component of a received optical signal and other frequency components which are not allowed (e.g., not detectable) by the TIA while detecting an AC component of the optical signal, so that the 1's and 0's signals can be received.

Figure 10:
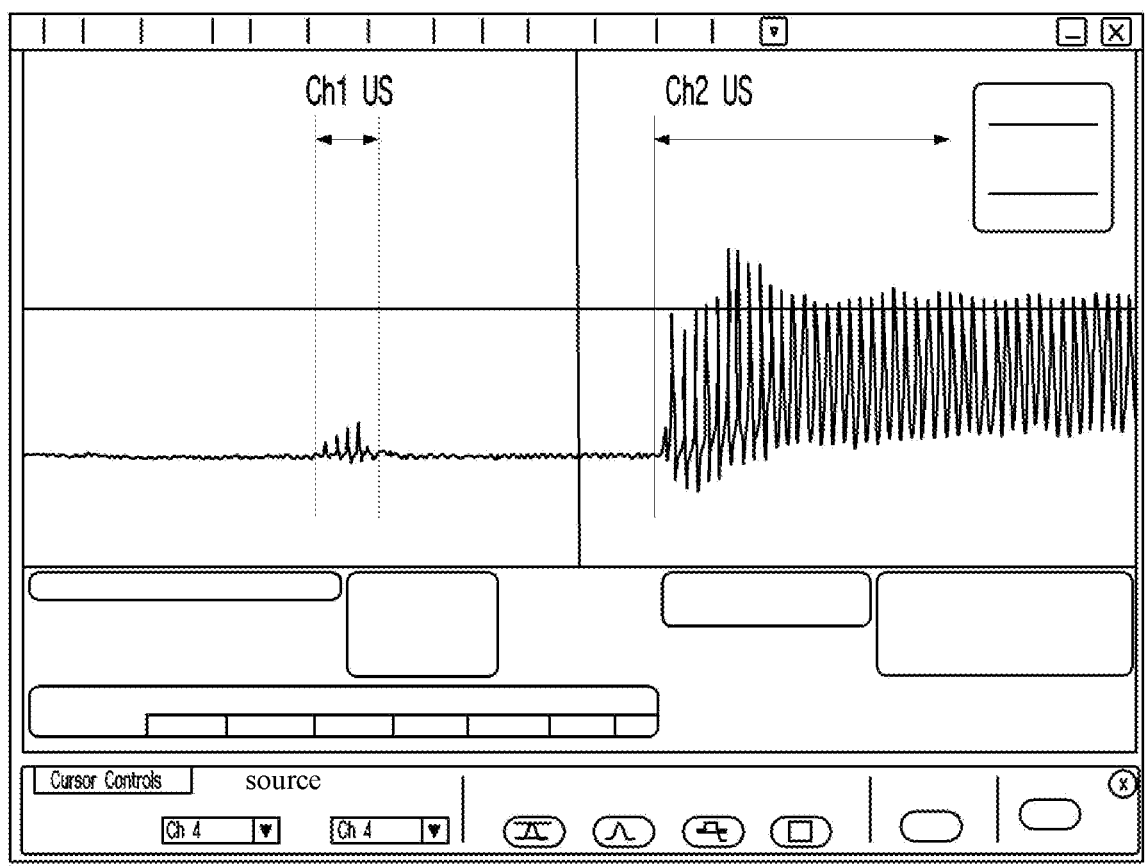
FIG. 10 depicts a diagram representing an experimental result of a channel crosstalk generated according to temperature variation of a laser active area when a heater and a signal with a predetermined width are alternately applied to a conventional optical transmitter are active, according to prior art.

Depicted in FIG. 10(a) is a BEN signal. The operation of an ideal semiconductor laser driver is to output a driving current for 1's and 0's signals as a laser driving current upon the receipt of the BEN signal, as depicted in FIG. 15(b), however, referring to FIG. 15(c), a semiconductor laser driver provides a current driving signal beginning from a current of the laser off and after a certain delay time its amplitude is modulated according to 1's and 0's data signals. A frequency of the current driving signal being modulated is present by a system.

Thus, the modulated signal with a frequency used for communication will be transmitted even during an elapse time for the laser to transit from an off-state to a normal state where the laser outputs a normal signal level. For example, the elapse time may be 1 to 100 nanoseconds although shown as 1 to 500 nanoseconds in FIG. 15. The term elapse time can be interchangeable with an "idle time" in the instant application.

Figure 1:
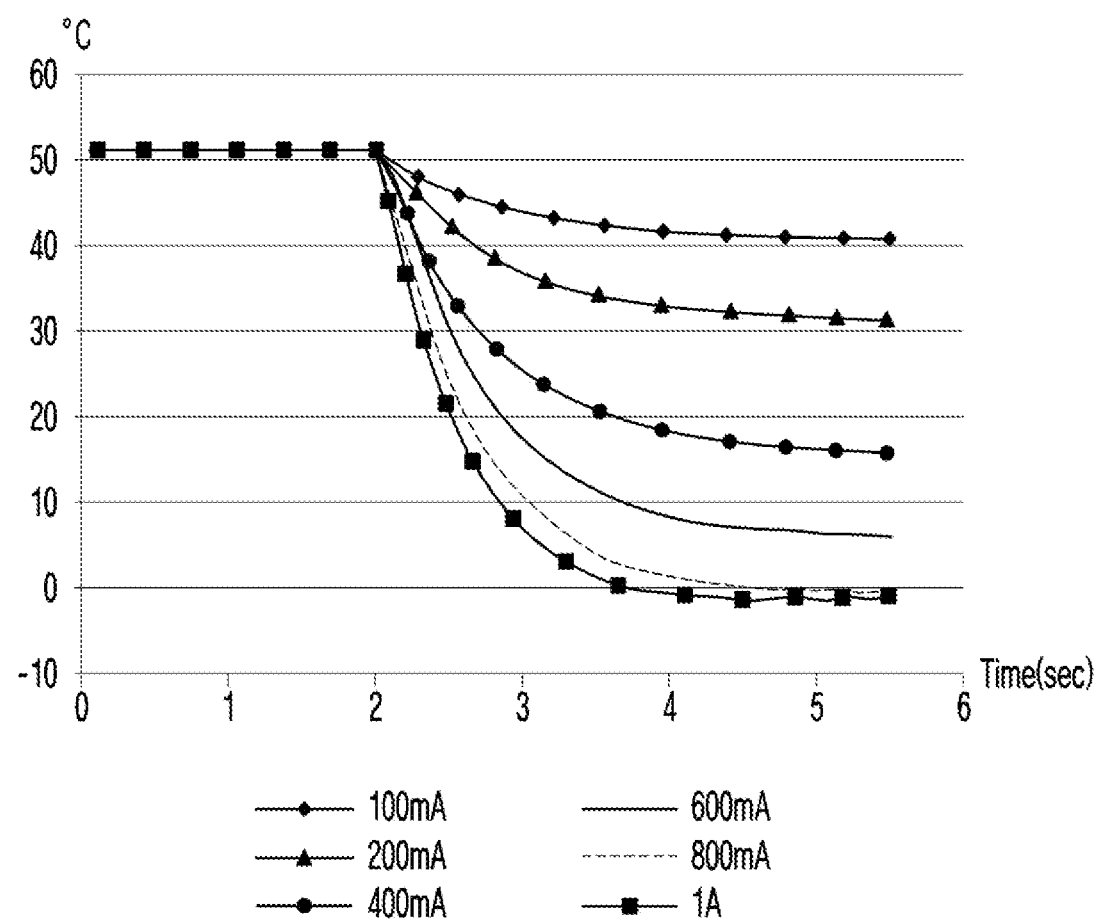
FIG. 1 depicts graphs representing temperature drop speeds due to a thermal-electric cooler (TEC) device.
Figure 2:
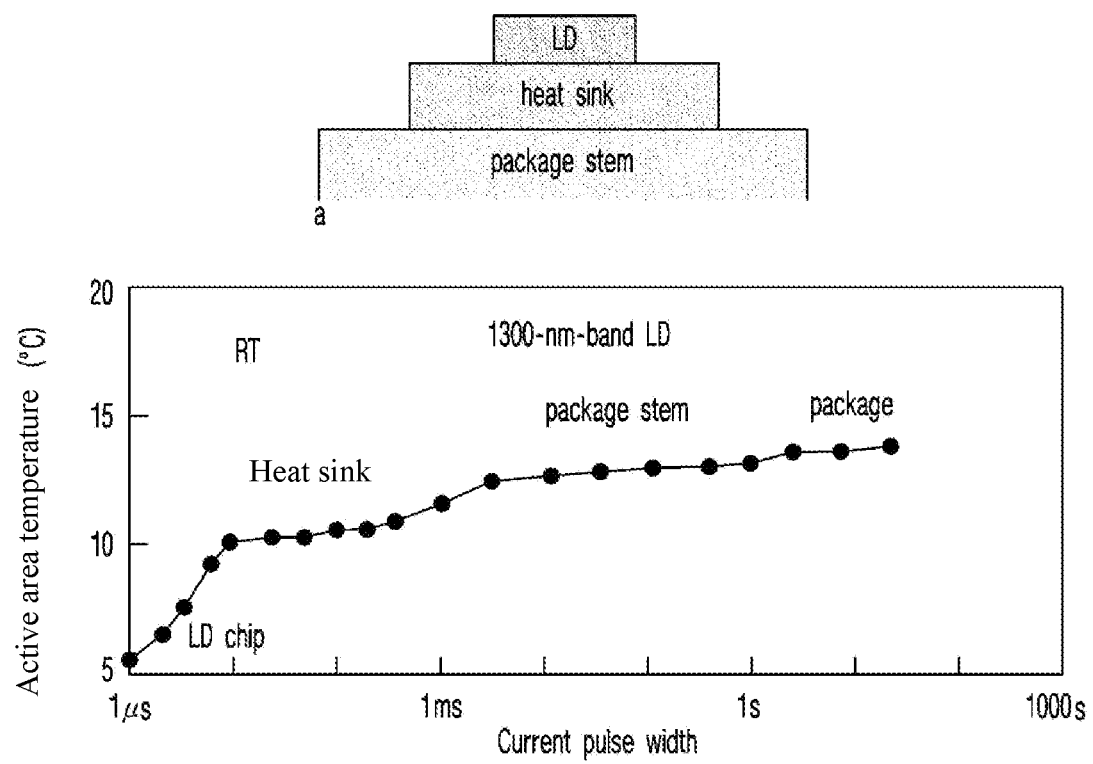
FIG. 2 depicts a graph representing temperature variation of a laser active area according to a pulse width.
Figure 3:
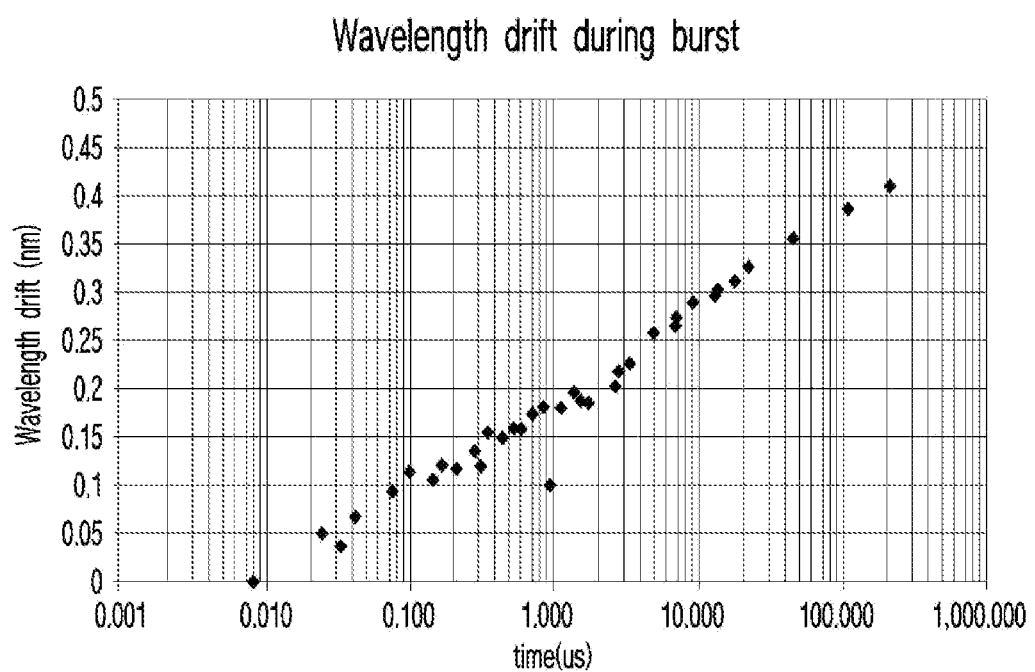
FIG. 3 depicts a graph representing variation of a wavelength drift according to a pulse width.
Figure 4:
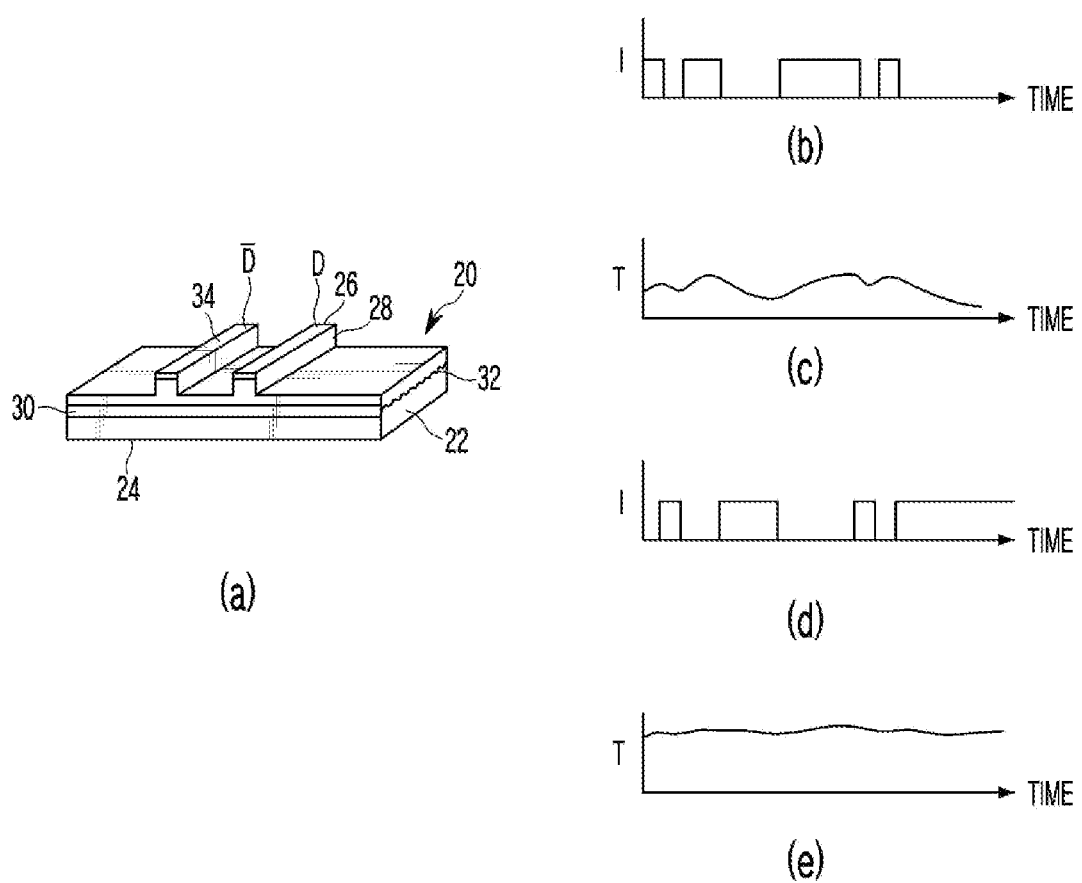
FIG. 4 depicts a diagram of an optical transmitter, according to prior art.
Figure 5:
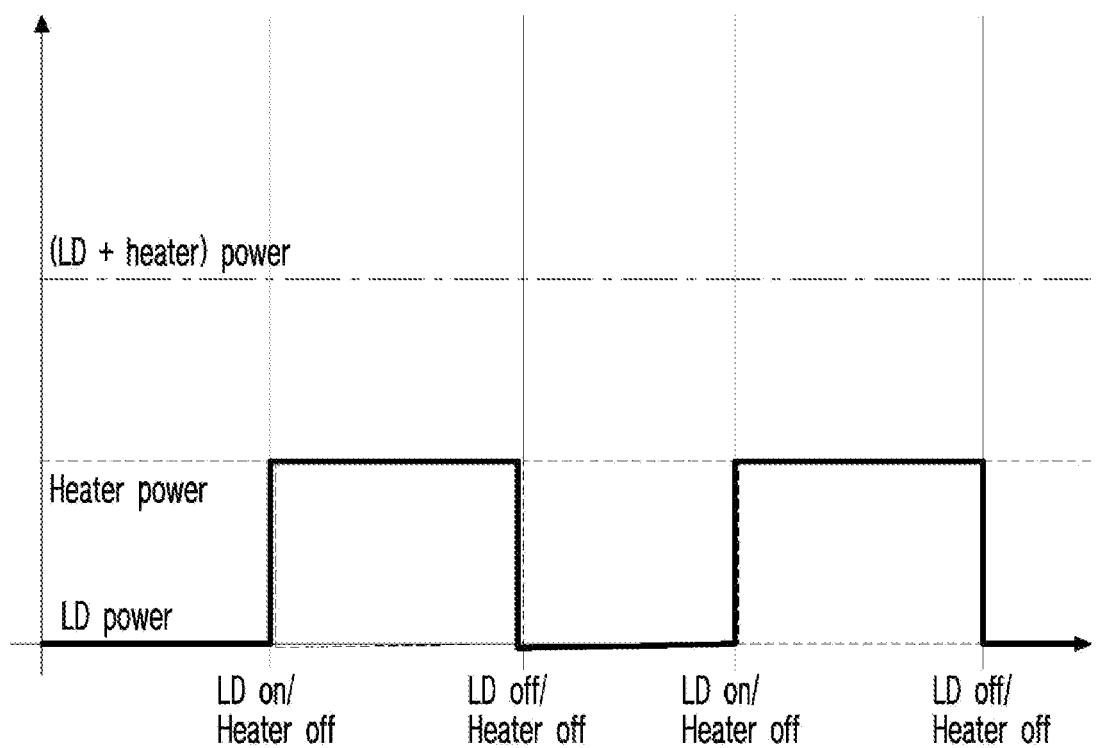
FIG. 5 depicts graphs with regard to an embodiment of an optical transmitter where a laser and a heater are alternately operated over time, according to prior art.
Figure 6:
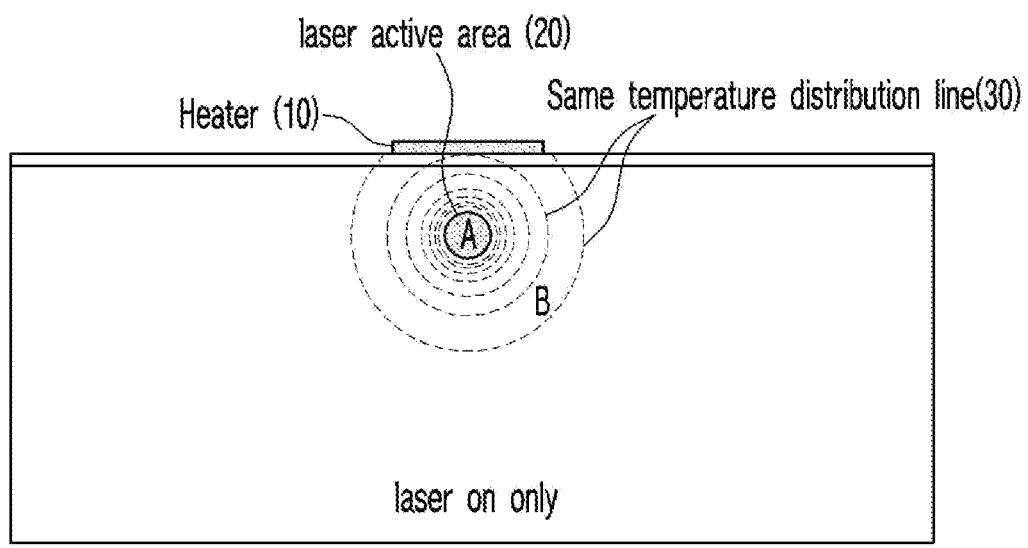
FIG. 6 depicts diagrams representing temperature distributions, respectively, in case a heater and a laser within a conventional optical transmitter are active, according to prior art.
Figure 6:
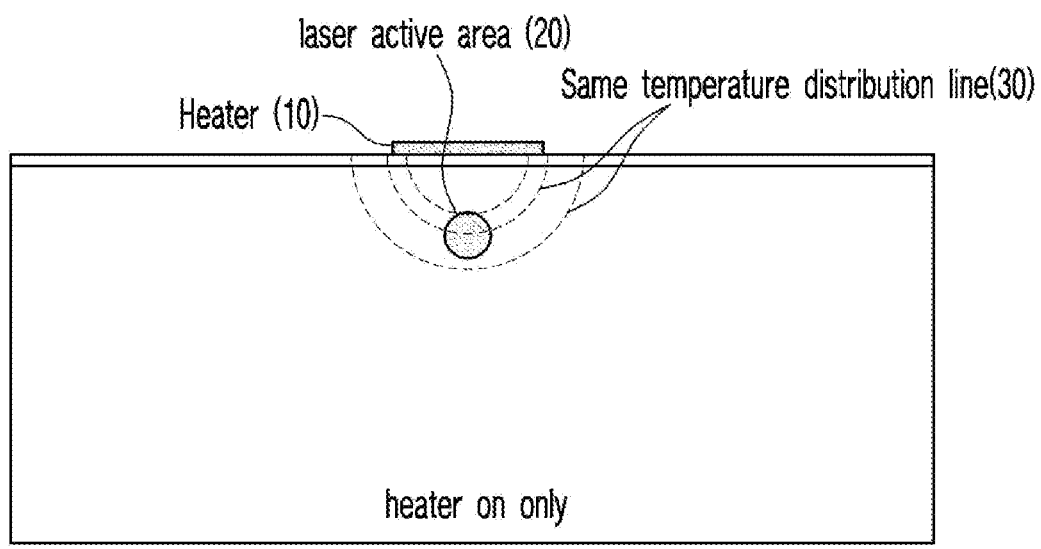
Figure 7:
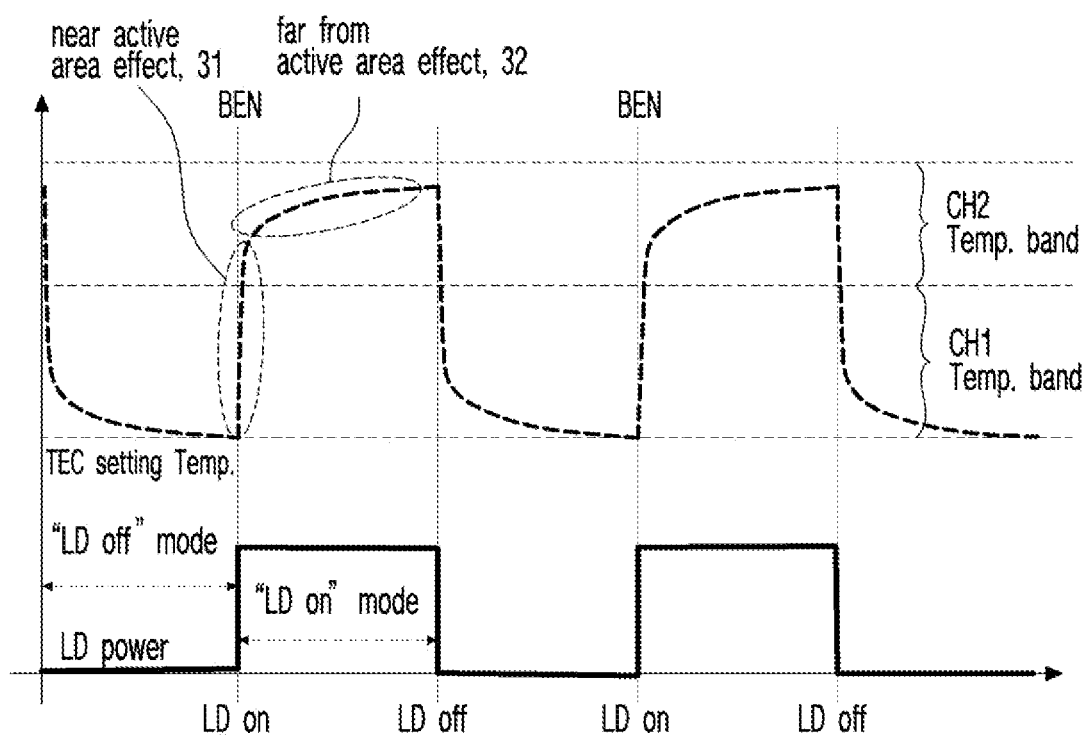
FIG. 7 depicts a diagram representing temperature variation of a laser active area when a signal with a predetermined width is applied to a conventional optical transmitter are active, according to prior art.

During this elapse time, there occurs a rapid current change in the laser diode, thus resulting in the temperature variation of the laser active area and the wavelength shift of the laser light, as illustrated in FIG. 7.

FIG. 15(d) depicts a laser driving method for suppressing a crosstalk at a receiver by applying a specific current driving signal during the elapse time. Here, the specific current signal is a signal modulated with a frequency which is not detectable at the receiver (e.g., TIA).

As shown in FIG. 15(d), a method for a laser driving device provides the specific current signal. For example, an amplitude of the current driving signal simply rises without being modulated during the idle time when the laser is turned on in response to receiving the BEN signal and is modulated after the end of the idle time. The rise speed of the current signal or the magnitude thereof can be determined according to a characteristic of the optical transmitter, it is preferable that the final amplitude of the rising current signal is greater than a threshold current (Ith). In addition, in one embodiment, if a TIA filtering out a predetermined frequency component other than the DC component is used at a receiver, the current signal for being provided will be modulated with the predetermined frequency even in the idle time.

The temperature of the laser active area is only dependent on the current applied to the laser active area, but is independent from whether the current is modulated or not. Therefore, during the idle time, the laser is heated by one of the current signals of FIG. 15 applied to the laser active area. The current signals include a signal not modulated or a signal modulated with a frequency that is not detectable at the receiver.

During the idle time, however the laser diode can generate light with other wavelengths than a wavelength of a predetermined channel (or a desired channel), however such light is not modulated during the idle time and is modulated with a frequency that is not detectable at the receiver, so that it will automatically be blocked by the TIA at the receiver and will not serve as a crosstalk to other channels.

Thus, during the idle time of FIG. 15(d), the current signal applied to the laser active area serves to increase the temperature of the laser active area, but will not serve as a crosstalk to other channels at the receiver since an optical signal generated during the idle time has a frequency that will be filtered out at the receiver, unlike the modulation frequency that is predetermined for communication by the system.

Referring back to FIG. 10, a modulated portion appearing in the vicinity of a center of channel 1 corresponds to a modulated crosstalk signal. If the embodiment of the present invention is applied, the crosstalk signal at channel 1 is not modulated, so that it will not be detected through the TIA and will not appear on the screen of the measurement instrument of FIG. 10, and thus, the crosstalk might not impact on the channel 2.

During the idle time, the temperature of the laser active area is heated to be normal temperature, so that when the laser generates an optical signal modulated with a normal modulation frequency (e.g., a predetermined frequency corresponding to a channel for communication) after the end of the idle time of FIG. 15, the modulated optical signal may have a predetermined wavelength pertaining to the channel in a state where the temperature of the laser active area reaches a normal temperature, and thus, there occurs no crosstalk even after the idle time.

In addition, FIG. 15(d) depicts an ideal operation of a laser driver where a current signal corresponding to 1's and 0's signals can be applied to a laser right after the end of the idle time. Since a practical laser driver cannot generate a current signal corresponding to 1's and 0's signals immediately after the modulation signal starts to be applied to the laser driver, there occurs a time delay until an appropriate current signal for the 1's and 0's signals is generated from when the modulation signal is applied to the laser driver.

Figure 16:
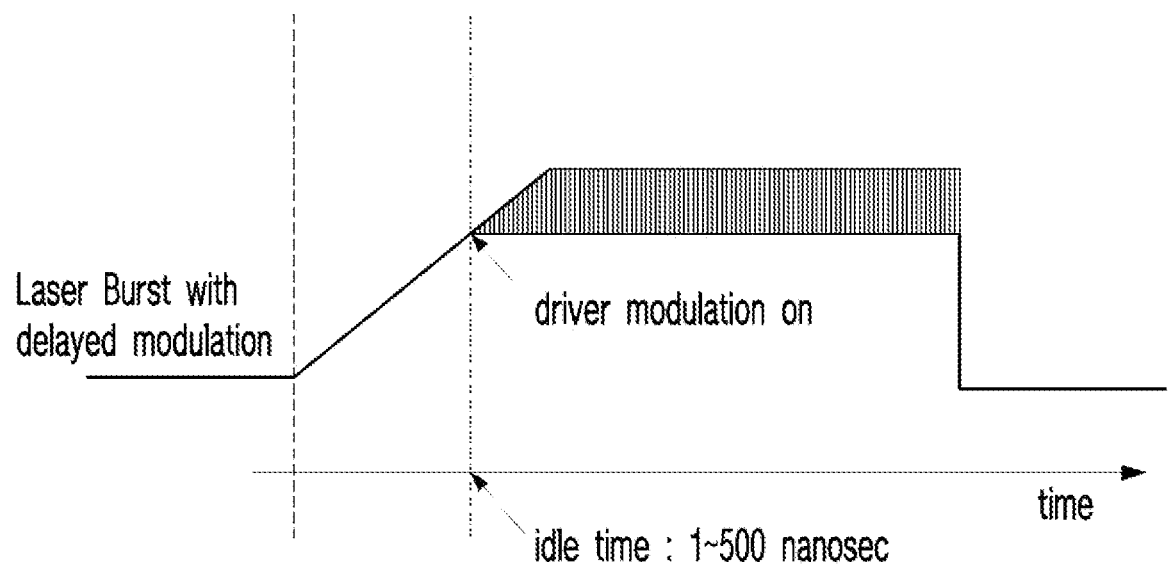
FIG. 16 depicts a more detailed graph representing current applied to a light source from a driver in an optical transmitter according to the first embodiment of the present invention.

FIG. 16 depicts a graph explaining as to how an appropriate modulated current is generated from when the modulation signal is applied upon the modulation signal is applied, in case of the modulation signal being applied after the idle time unlike the ideal case depicted in FIG. 15d, according to an embodiment of the present invention. This time delay (or idle time) occurs because the laser driver IC for the laser implements current signals such as Ibias and Imod by using charging/discharging processes at capacitors and a certain amount of time delay is required for the current being charged or discharged, so that the normal Imod can be obtained.

In order to stably generate the modulated signal with desired 1's and 0's signals, a time longer than at least 50 nanoseconds is required. In order to obtain a normal modulation current, as illustrated in FIG. 15(d), it is required that the temperature of the laser active area is heated during the idle time based on the non-modulated current signal to get the laser driver to start generating of the current signal while having the laser active area temperature to be a value appropriate to a corresponding (or predetermined) channel, so that the signal modulated along with an appropriate amplitude should be able to be applied to the laser diode at the same time when the idle time ends.

However, in the NG-PON2, the idle time is required to be less than 100 nanoseconds. Thus, if a minimum time required for the current signal stabilization is set to be 50 nanoseconds, as explained earlier, a time available for heating the laser active area with the non-modulated current signal will be at most 50 nanoseconds.

If the time taken for the current to be normalized gets longer, the time available for heating the laser active area with the non-modulated current signal is merely 40 nanoseconds. Thus, there is a need for sufficiently heating the temperature of the laser active area within this short time period.

Referring to FIGS. 15(d) and 16, if an amplitude of a current rising during the idle time is set to be Ibias, a communication can immediately start by applying only Imod to the laser after the end of the idle time.

Figure 17:
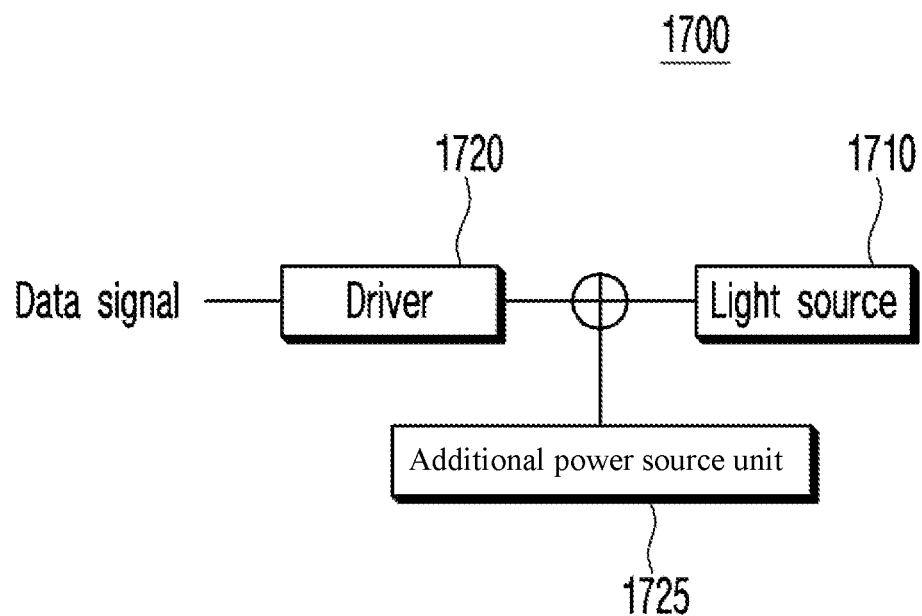
FIG. 17 depicts a diagram representing a configuration of an optical transmitter according to an embodiment of the present invention.

FIG. 17 depicts a diagram of an optical transmitter according to an embodiment of the present invention.

Referring to FIG. 17, the optical transmitter 1700 according to an embodiment of the present invention includes a light source 1710 and a driver 1720. The driver 1720 may include an additional power source unit (not shown) for supplying the first additional power. The optical transmitter 1700 may further include an additional power source unit 1725 in addition to the additional power source unit of the driver 1720. In other embodiments, the optical transmitter 1700 may only include the additional power source unit 1725 without the additional power source unit of the driver 1720. The light source 1710 receives driving power and a data signal from the driver 1720 and transmits light with the data signal. The driving power may correspond to a current whose amplitude is greater than a threshold value to allow the optical source 1710 to transmit 1's and 0's signals.

The optical source 1710 transmits the data signal upon receiving the driving power. A wavelength of the light source 1710 depends on its temperature. The optical wavelength is affected by internal temperature of the light source 1710 as well as ambient temperature surrounding the light source 1710 or temperature of housing thereof. Since the temperature of the light source 1710 is affected by an amplitude of the current applied thereto, the wavelength of the light emitted from the light source 1710 is affected by the amplitude of the current applied thereto and a time when the current starts to be applied.

Figure 11:
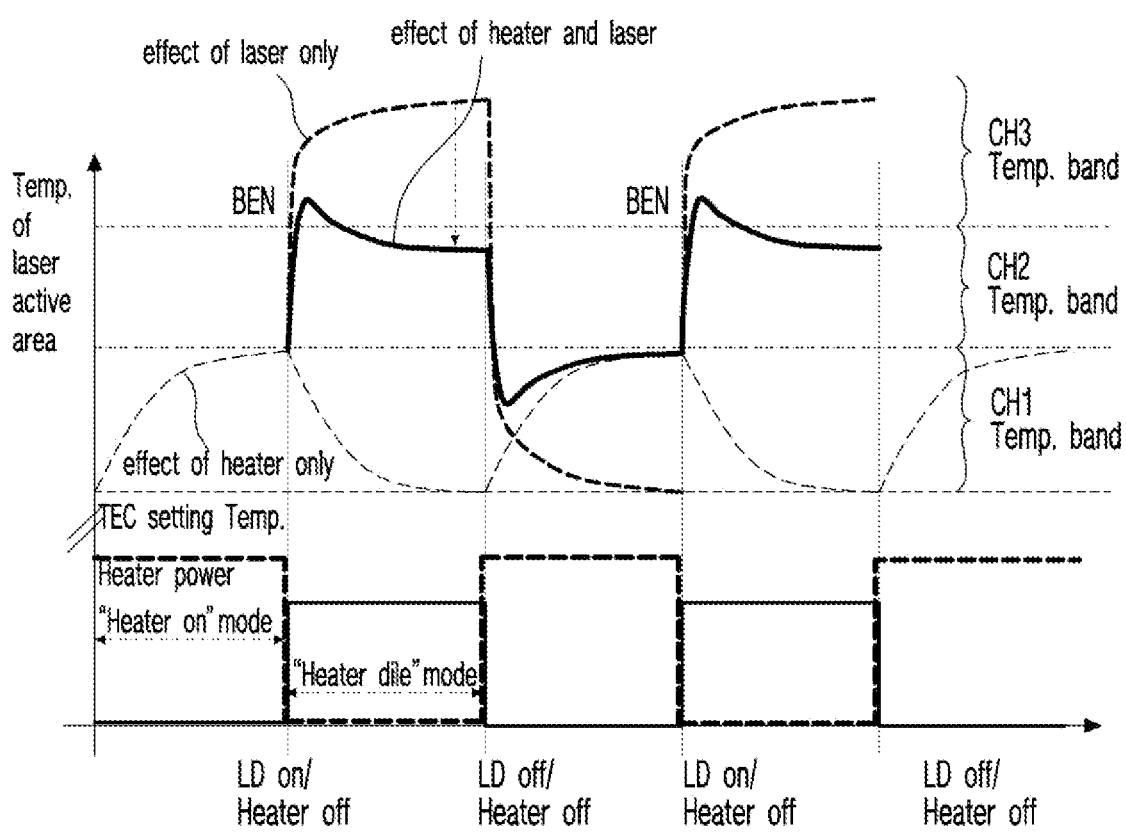
FIG. 11 depicts a diagram representing temperature variation of a laser active area when a signal with a predetermined width is applied to a conventional optical transmitter are active, according to prior art.

When an appropriate time elapses after the applying of the current signal to the light source 1710, the internal temperature of the light source 1710 rises up to a level appropriate for a corresponding wavelength channel, so that the optical signal can be transmitted over a desired wavelength channel (e.g., channel 2 of FIGS. 11 through 13).

It is obvious that the temperature of the light source cannot increase right after the current signal is applied thereto. It is also obvious that the temperature of the light source increases up to a predetermined level appropriate for a corresponding wavelength channel, when an appropriate time elapses after the applying of the current signal to the light source 1710.

Thus, if the modulated current signal is applied to the light source before the temperature of the light source increases to the level appropriate for the corresponding predetermined wavelength channel, there may be generated an optical signal with a wavelength other than the desired wavelength channel band, thus resulting in a crosstalk to a channel other than the desired channel due to the optical signal generated at the wavelength band other than the desired wavelength band.

In order to address this problem, the current signal which is modulated with a frequency not detectable at the receiver can be applied to the light source before the temperature of the light source is stabilized. The term "frequency not used for communication" may be understood as a frequency (e.g., frequency pertaining to a modulation rate of 5 Gbps or a few hundreds of Mbps at a data transmission speed of a 10 Gbps) to be removed at a receiver.

Therefore, a current signal of which amplitude simply rising can be used for the purpose of stabilizing the temperature of the light source without causing a crosstalk. However, the NG-PON2 standard requires for a modulated optical signal to be transmitted within 100 nanoseconds after the receipt of the BEN signal. To this end, the temperature of the light source needs to be heated to the predetermined level appropriate for the desired channel within such time.

A degree of the heating on the active area of the light source is determined by a multiplication between an amplitude of the current signal applied to the light source before the generation of the modulated signal and a time. Thus, for the fast stabilization of the light source temperature before the beginning of the light source modulation, the light source can be driven by a current signal with a high amplitude, or a time interval from the receipt of the BEN signal to the beginning of the modulated signal generation can be increased.

However, since in the NG-PON2 the time interval from the receipt of the BEN signal to the beginning of the modulation signal generation is limited to 100 nanoseconds, the light source temperature needs to be stabilized within such time interval. When the burst enable (BEN) signal is received, the driver 1720 supplies power to the light source 1710.

The driver 1720 includes a configuration for supplying driving power to the light source 1710 or supply power to the light source 1710 by receiving power from the outside (not shown). The driving power rises with a first average slope from an initial value to a threshold value. In this case, however, since a time to reach the threshold value is significantly delayed, there may occur a crosstalk toward a channel other than the desired channel.

In order to prevent the crosstalk toward the channel other than the desired channel, the driver 1720 may include a configuration for supplying additional power in addition to the configuration for supplying the driving power, so that the additional power along with the driving power can be supplied to the light source 1710.

Hereinafter, the configuration for supplying the additional power in the driver 1720 may be referred to as a "first additional power source unit and the additional power provided by the first additional power source unit is referred to as a "first additional power" if necessary.

Similarly, the additional power source unit 1725 may be referred to as a "second additional power source unit 1725" for being distinguished from the first additional power source unit and the additional driving power provided by the second additional power source unit 1725 may be referred to as a "second additional power" if necessary. The term "additional power" may be the first additional power, the second additional power, or a combination of the first and second additional power.

Thus, the driver 1720 including the configuration (e.g., the first additional power source unit) for supplying the first additional power may provide the light source 1710 with driving power having a second average slope greater than the first average slope.

In other embodiments, the driver 1720 may supply driving power with the first average slope, but the second additional power generated by the second additional power source unit 1725 may be applied to the light source 1710 before applying the driving power supplied from the driver 1720 to the light source 1710. For example, the second additional power generated by the second additional power source 1725 is applied to the light source 1710 along with the driving power generated by the driver 1720.

A time required for the temperature of the laser active area to reach a desired level becomes significantly shorter as the light source 1710 is supplied with the second additional power (e.g., the first additional power or a combination of the first and second additional powers) in addition to the driving power. The driver 1720 receives a data signal from outside and provides the same to the light source 1710. However, the driver 1720 does not provide the data signal at the same time as the driving power, but provides the data signal after a predetermined time from the applying of the driving power to the light source 1710.

In this case, the predetermined time (e.g., a time interval from the applying of the driving power to the light source 1710 to the providing of the data signal to the light source 1710) is set differently between: when only the driving power with the first average slope is applied to the light source 1710; and when the additional power is applied to the light source 1710 along with the driving power.

This is because a time required for the laser active area temperature to reach the desired normal level is different for the both cases. The predetermined time set as a time interval from the applying of the driving power to the providing of the data signal when only the driving power is applied can be longer than the predetermined time set when the additional power (e.g., the first additional power, the second additional power, and/or a combination thereof) is applied along with the driving power. Thus, a crosstalk to other channels than a desired channel can be prevented by the driver 1720 which provides the data signal to the light source 1710 after the predetermined time from the applying of the driving power to the light source 1710. The second additional power source unit 1725 provides the second additional power to the light source 1710.

Although it is illustrated in FIG. 17 that the second additional power source unit 1725 is connected to an output node of the driver 1720, embodiments of the present invention are not limited thereto. For example, the second additional power source unit 1725 is connected to an input node of the driver 1720 so as to allow the driver 1720 to provide both the driving power and the second additional power to the light source 1710.

Figure 18:
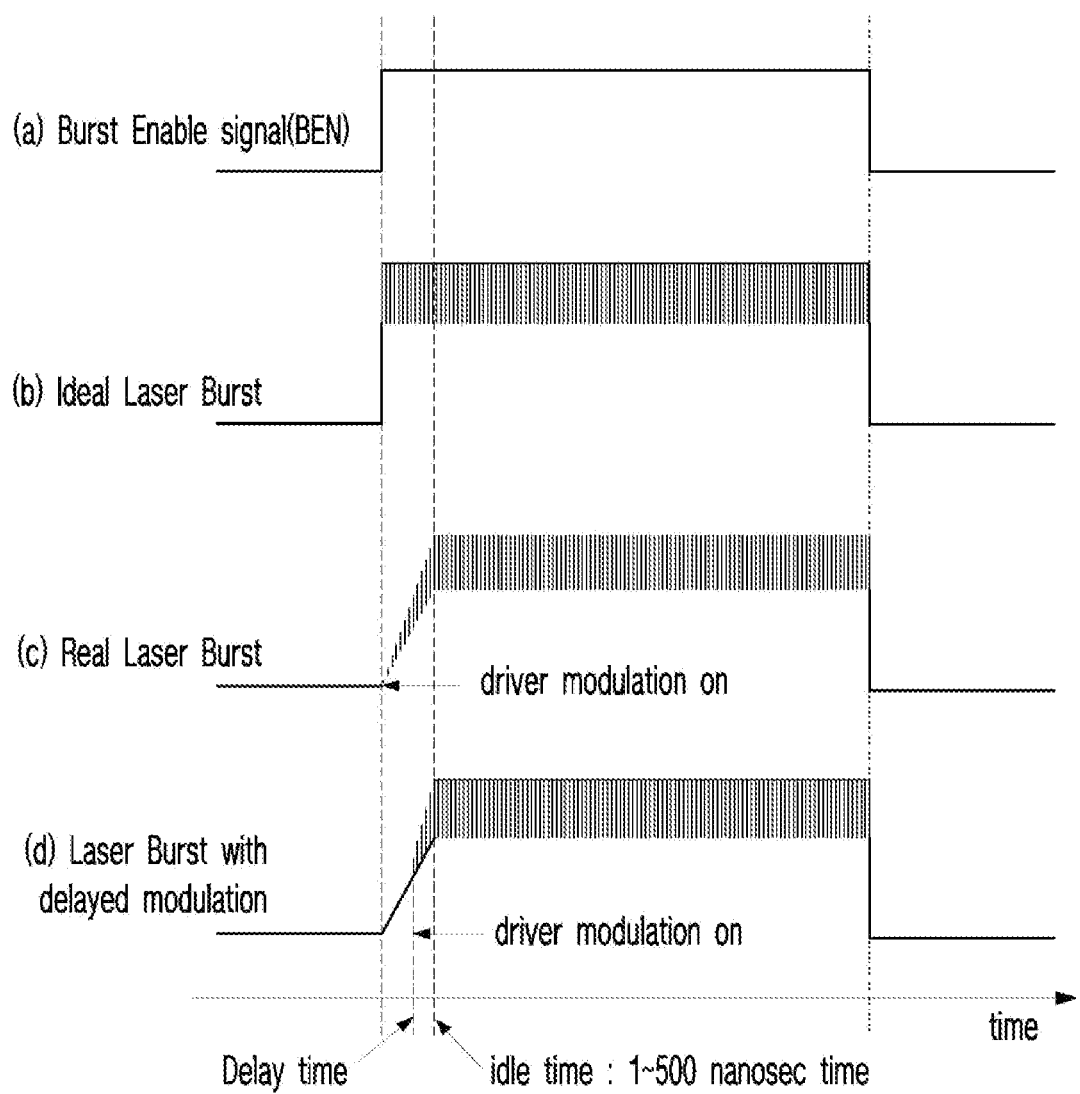
FIG. 18 is a diagram representing current applied to a light source from a driver in an optical transmitter according to a second embodiment of the present invention.
Figure 19:
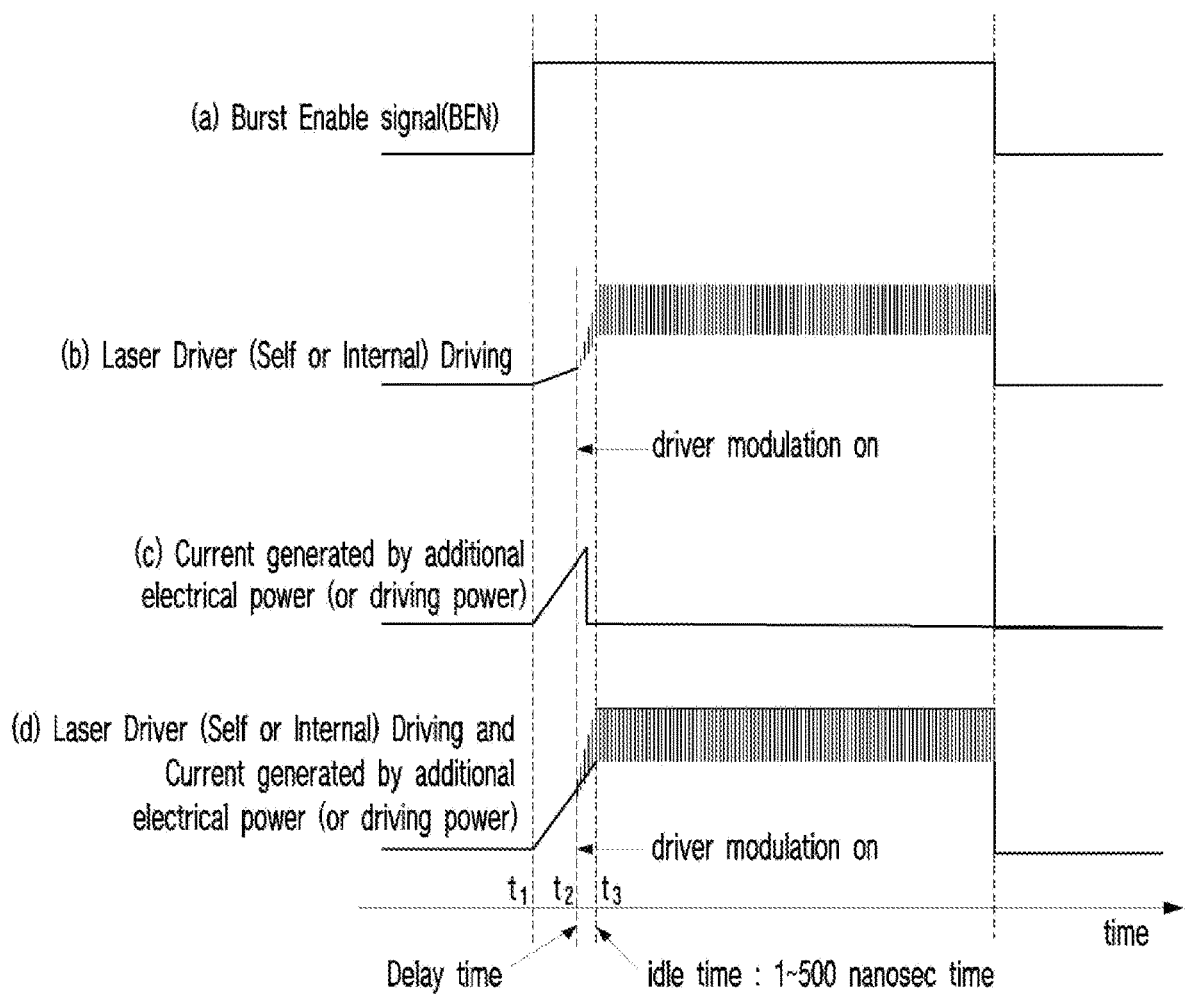
FIG. 19 is a graph depicting each signal applied to the optical transmitter according to the second embodiment of the present invention.

FIG. 18 depicts a BEN signal and respective currents applied into the light source from the driver of the optical transmitter according to a second embodiment of the present invention. FIG. 19 depicts a BEN signal and respective currents applied into the light source from the driver of the optical transmitter and additional circuits, according to a second embodiment of the present invention. Referring to FIG. 19(*b*), the applying of a current including a data signal into the light source 1710 from the driver 1720 can begin at a time t3 after a predetermined time from a time t1 when the BEN signal is received, instead of applying the data signal from the driver 1720 to the light source 1710 immediately after the receipt of the BEN signal.

For example, as illustrated in FIG. 19(*b*), the driver 1720 provides a current signal whose amplitude rises with a first average slope from t1 (e.g., a time when the BEN signal is received) to t2 (e.g., a time after the predetermined time from t1). The driver 1720 provides a modulated current signal to the light source 1710 during a period from t2 to t3, and the driver 1720 further provides a modulated current signal containing data for being transmitted after t3. In some aspects, t2 and t3 may be preset, respectively.

As illustrated in FIG. 19(*c*), the light source 1710 is supplied with the first additional power by the first additional power source unit which is another configuration within the driver 1720 and/or the second additional power by the second power source unit 1725, in addition to the driving power provided by the driver 1720. Said another configuration is a part of the driver 1720 in addition to a configuration within the driver 1720 for providing the driving power.

Here, preferably, a rise slope of the first additional power or the second additional driving power is greater than the first average slope of the driving power, but it is not limited thereto. For example, the rise slope can be approximate to or smaller than the first average slope. Thus, the light source 1710 such as a laser diode is supplied with the driving power from the laser driver 1720 and the second power source unit 1725, and in this case, as illustrated FIG. 19(*d*), for a time period between t1 and t2, the power supplied to the light source through the driver 1720 and the second additional power source unit 1725 is greater than the power only supplied through the driver 1720 by itself. Thus, this allows the laser active area to reach a desired temperature within a relatively short time period.

The output current from the second power source unit 1725 can simply increase, e.g., without being modulated. In one embodiment, the output current from the second power source unit 1725 may increase step-wise or may increase, being modulated at a frequency that is not detectable at a receiver. The driving power and the data signal as illustrated in FIG. 19(*d*) are finally applied to the light source 1710.

By having the light source 1710 supplied with the first additional power from the driver 1720 or the second additional power from the second power source unit 1725, the temperature of the laser active area can increase quickly, so that the data modulation of the driver 1720 can be made normal at a predetermined time t3 and the temperature of the light source 1710 can be heated enough to facilitate a data signal transmission without a channel crosstalk.

Preferably, a time interval between the time (e.g., t1) at when the receiving of the BEN signal begins and the time t2 at when the modulation operation of the driver 1720 begins ranges from 30 nanoseconds to 70 nanoseconds, and the supplying of the additional power (e.g., the first additional power or the second additional power) can end between the times t1 and t2, which ensures the temperature rise of the light source 1710 due to the current signal which is not modulated or is modulated with a crosstalk-free frequency. In addition, the ending in supplying the additional power between the times t2 and t3 prevents the additional power from serving as a noise source to a data signal for being transmitted.

To this end, for example, the supplying of the additional power can be ended between 40 nanoseconds and 80 nanoseconds from the initial receipt (e.g., t1) of the BEN signal. It may take approximately 10 nanoseconds to 20 nanoseconds until the additional power completely disappears.

In addition, the ending of the additional power does not necessarily mean the complete ending thereof. That is, the ending of the additional power may be understood such that the additional power is reduced, compared to its maximum, so that the temperature of the light source 1720 can be controlled to have its output wavelength is positioned within a predetermined wavelength zone of the desired channel. For example, the ending of the additional power includes reducing the additional power by more than 10% of the maximum thereof.

Some laser drivers may implement an element or function pertaining to the first additional power therein. Thus, in the present invention, the second additional power source unit 1725 is not necessarily separated from the laser driver 1710. For example, in case the laser diode driver 1720 includes a current unit for driving itself and a configuration for supplying additional power, the laser diode driver 1720 and the second additional power source unit 1725 can be implemented into a single device.

Figure 20:
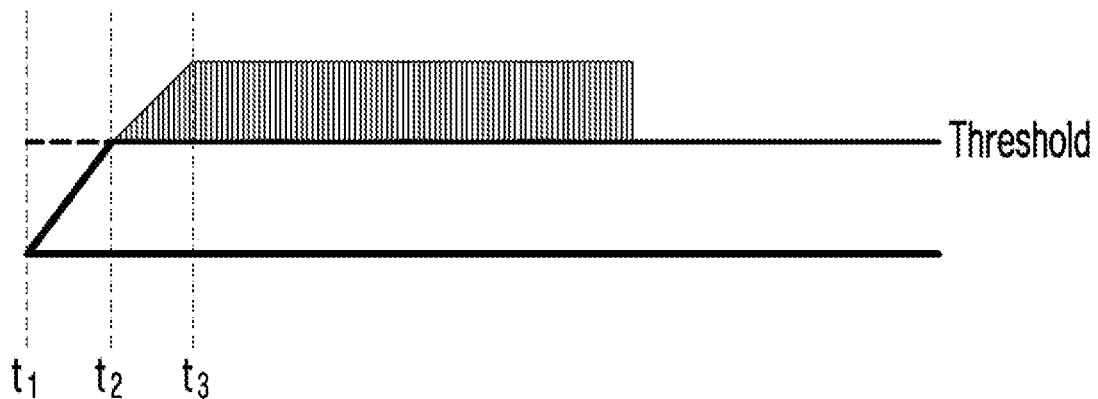
FIG. 20 is a graph depicting each signal applied to the optical transmitter according to a third embodiment of the present invention.

FIG. 20 depicts respective signals applied from the driver 1720 of the optical transmitter to the light source 1710 according to a third embodiment of the present invention. Referring to FIG. 20, the data signal starts to be applied to the light source 1710 at t3 after a predetermined time from t1 at when the BEN signal is received, as similar to the data signal illustrated in FIG. 19.

However, instead designing the driver 1720 to include an additional configuration (e.g., the first additional power source unit) for supplying the first additional power or having the second additional power source unit 1725 supply the second additional power to the light source 1710, the driver 1720 can be designed to increase a magnitude of the driving power itself, so that a rise slope thereof is greater than the first (average) slope.

That is, in case of the existing schemes, if the BEN signal is received, the currents Ibias and Imod are configured in the driver 1720. Further, after the idle time t3 passes, the Ibias and Imod containing the data signal for being transmitted are applied into the laser diode. In the present invention, during a period from t1 at when the BEN signal is received to t2 which is preset, a current, which is greater than Ibias required for signal transmission after the idle time, is applied into the laser diode, and after t2, Ibias and Imod applied after the idle time t3 are used for being configured. In view of these features, the temperature of the laser active area can be stabilized to a desired range faster than the existing schemes using the same current for both the period from t1 to t3 and the period after t3.

The above description would be possible only to those described as an example the technical idea of the present embodiment by way of example, those skilled in the art. An example of this embodiment and various modifications and variations without departing from the essential characteristics of this embodiment example. Accordingly, the embodiments are not intended to be is for illustrative and not intended to limit the technical idea of the present embodiment example, is limited to these embodiments within the scope of the technical idea of this embodiment, by example. Example protection scope of this embodiment to be interpreted by the following claims, all spirits within a scope equivalent will be construed as included in the scope of this embodiment example.

What is claimed is:

1. A method for providing power and a data signal to an optical transmitter including a light source, comprising performing:
   a first applying step of applying first driving power to the light source, an amplitude of the first driving power increasing with a first average slope in a time domain, the first applying step being performed after receiving a trigger signal;
   a second applying step of applying a first electrical modulated signal to the light source, the second applying step being performed after a first predetermined time elapses from when the trigger signal is received; and
   a providing step of a second electrical modulated signal to the light source, the second electrical modulated signal including data for being transmitted, the providing step being performed after a second predetermined time elapses from starting of the second applying step.

2. The method of claim 1, further comprising performing a third applying step of applying second driving power to the light source, the third applying step being performed after receiving the trigger signal.

3. The method of claim 2, wherein the third applying step comprises applying the second driving power whose amplitude increases with a second average slope.

4. The method of claim 3, wherein the second average slope is greater than the first average slope.

5. The method of claim 3, wherein the third applying step comprises: after the first electrical modulated signal has been applied to the light source, stopping the applying of the second driving power at a time before the first driving power reaches a reference value.

6. The method of claim 3, wherein the second applying step begins after a time of 30 nanoseconds to 70 nanoseconds elapses from the receiving of the trigger signal,
   wherein the third applying step ends after a time of 40 nanoseconds to 80 nanoseconds elapses from the receiving of the trigger signal, and
   wherein the third applying step ends after the second applying step begins.

7. The method of claim 3, wherein the third applying step ends upon a maximum of the applied second driving power being lower than a predetermined level.

8. The method of claim 1, wherein the first driving power and the first and second electrical modulated signals are provided to the optical transmitter.

9. An optical transmitter transmitting an optical data signal using a light source, comprising:
a driver configured to:
apply first driving power to the light source after receiving a trigger signal, an amplitude of the first driving power increasing with a first average slope in a time domain;
apply a first electrical modulated signal to the light source after a first predetermined time elapses from when the trigger signal is received; and
apply a second electrical modulated signal to the light source after a second predetermined time elapses from starting of the applying of the first electrical modulated signal, wherein the second electrical modulated signal including data for being transmitted; and
the light source configured to receive the first driving power and the first and second electrical modulated signals from the driver and transmit the optical data signal including the data to an optical receiver.

10. The optical transmitter of claim 9, wherein the driver is further configured to apply second driving power separately from the first driving power for driving the light source, subsequent to the receiving of the trigger signal.

11. The optical transmitter of claim 9, wherein the driver is further configured to apply the second driving power increasing with a second average slope, subsequent to the receiving of the trigger signal.

12. The optical transmitter of claim 11, wherein the second average slope is greater than the first average slope.

13. The optical transmitter of claim 10, wherein the driver is configured to stop the applying of the second driving power before the first driving power reaches a reference value, after the first electrical modulated signal has been applied to the light source.

14. The optical transmitter of claim 12, wherein the driver is further configured to stop the applying of the second driving power upon a maximum of the applied second driving power being lower than a predetermined level.

15. The optical transmitter of claim 9, wherein the driver is further configured to:
provide the first electrical modulated signal to the light source after a time of 30 nanoseconds to 70 nanoseconds elapses from the receiving of the trigger signal;
stop the applying of the second driving power for driving the light source after a time of 40 nanoseconds to 80 nanoseconds elapses from the receiving of the trigger signal,
wherein the applying of the second driving power ends after the applying of the first electrical modulated signal to the light source.

16. A method for providing power and a data signal to an optical transmitter including a light source, performing:
applying first driving power, using a first power source, to the light source in response to receiving of a trigger signal, wherein an amplitude of the first driving power increases with a first average slope in a time domain, and the applying of the first driving power starts at a first time point after the receiving of the trigger signal; and
applying second driving power using a second power source different from the first power source, to the light source in response to the receiving of the trigger signal, wherein an amplitude of the second driving power increases with a second average slope in the time domain, the applying of the second driving power starts at a second time point after the receiving of the trigger signal, and the second time point is later than the first time point.

17. The method of claim 16, further comprising:
applying a first electrical modulated signal to the light source in response to the receiving of the trigger signal, the applying of the first electrical modulated signal being performed at a third time point after receiving the trigger signal.

18. The method of claim 17, further comprising:
applying a second electrical modulated signal including data for being transmitted in response to the receiving of the trigger signal, the applying of the second electrical modulated signal starts at a fourth time point after starting of the applying of the first electrical modulated signal.

19. The method of claim 16, wherein the second average slope is greater than the first average slope.

20. The method of claim 16, wherein the applying of the second driving power comprises: after the first electrical modulated signal has been applied to the light source, stopping the applying of the second driving power at a time before the first driving power reaches a reference value.

* * * * *